US010914433B2

United States Patent
Grandadam

(10) Patent No.: US 10,914,433 B2
(45) Date of Patent: *Feb. 9, 2021

(54) PORTABLE LANTERN LIGHT WITH MULTIPLE OPERATING MODES

(71) Applicant: Promier Products Inc., Peru, IL (US)

(72) Inventor: Cody Duane Grandadam, Peru, IL (US)

(73) Assignee: Promier Products Inc., Peru, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/826,785

(22) Filed: Mar. 23, 2020

(65) Prior Publication Data

US 2020/0224835 A1     Jul. 16, 2020

Related U.S. Application Data

(63) Continuation of application No. 16/531,938, filed on Aug. 5, 2019, now Pat. No. 10,598,319, which is a (Continued)

(51) Int. Cl.
   *F21V 21/00*     (2006.01)
   *F21L 4/02*     (2006.01)
   (Continued)

(52) U.S. Cl.
   CPC ............... *F21L 4/02* (2013.01); *F21V 5/006* (2013.01); *F21V 15/01* (2013.01); *F21V 21/145* (2013.01);
   (Continued)

(58) Field of Classification Search
   CPC . F21L 4/02; H05K 1/181; H05K 2201/10106; H05B 33/0827;
   (Continued)

(56) References Cited

U.S. PATENT DOCUMENTS

| 4,782,432 A | 11/1988 | Coffman |
| D300,602 S | 4/1989 | Smith, Sr. |

(Continued)

OTHER PUBLICATIONS

International Search Report and Written Opinion issued to PCT/US18/47730 dated Nov. 1, 2018, 7 pages.

(Continued)

*Primary Examiner* — Laura K Tso

(74) *Attorney, Agent, or Firm* — Barnes & Thornburg, LLP

(57) ABSTRACT

A portable lantern light is configured to be operated in a range of selectable operational modes to provide flexible illumination solutions in both stationary and portable situations. The lantern light includes an elongated central body with a plurality of external longitudinal ribs, longitudinal channels positioned between a pair of external ribs, a lighting element residing within the channel, and a lens overlying the lighting element that acts as a primary optic. A power source that includes a battery cartridge is removably inserted within a receiver of the central body. The lantern light includes an operating mode selector assembly to control which lighting elements are illuminated during operation of the portable lantern light, and a luminosity selector assembly to selectively control the lumen output (brightness) of the lighting elements. The lantern light also includes a retractable stabilization assembly that can be deployed to stabilize the light on a support surface.

22 Claims, 27 Drawing Sheets

Related U.S. Application Data continuation of application No. 16/110,406, filed on Aug. 23, 2018, now Pat. No. 10,371,326, which is a continuation-in-part of application No. 29/614,796, filed on Aug. 23, 2017.

(60) Provisional application No. 62/549,247, filed on Aug. 23, 2017.

(51) Int. Cl.
| | | |
|---|---|---|
| *F21V 5/00* | (2018.01) | |
| *F21V 23/04* | (2006.01) | |
| *F21V 15/01* | (2006.01) | |
| *F21V 21/14* | (2006.01) | |
| *H05K 1/14* | (2006.01) | |
| *H05B 45/00* | (2020.01) | |
| *H05B 45/10* | (2020.01) | |
| *H05B 45/46* | (2020.01) | |
| *H05B 47/175* | (2020.01) | |
| *F21Y 115/10* | (2016.01) | |
| *H05K 1/18* | (2006.01) | |

(52) U.S. Cl.
CPC ......... *F21V 23/0414* (2013.01); *H05B 45/00* (2020.01); *H05B 45/10* (2020.01); *H05B 45/46* (2020.01); *H05B 47/175* (2020.01); *H05K 1/144* (2013.01); *F21Y 2115/10* (2016.08); *H05K 1/181* (2013.01); *H05K 2201/042* (2013.01); *H05K 2201/09027* (2013.01); *H05K 2201/10106* (2013.01)

(58) Field of Classification Search
CPC ..... H05B 33/0845; F21V 5/006; F21V 15/01; F21V 21/145; F21V 23/0414
USPC .......................................... 362/184, 190, 202
See application file for complete search history.

(56) References Cited

U.S. PATENT DOCUMENTS

| | | | |
|---|---|---|---|
| D308,258 S | 5/1990 | Kung-kit et al. | |
| 5,003,441 A | 3/1991 | Crowe et al. | |
| 5,068,773 A | 11/1991 | Toth | |
| 5,072,345 A | 12/1991 | Goggia | |
| 5,550,727 A | 8/1996 | Fenyvesy | |
| 5,642,931 A | 7/1997 | Gappelberg | |
| 5,758,949 A | 6/1998 | Van Deursen | |
| D417,022 S | 11/1999 | Chiu | |
| 6,030,094 A | 2/2000 | Sedovic et al. | |
| 6,179,431 B1* | 1/2001 | Chien .................. | F21L 4/02 362/184 |
| 6,979,100 B2* | 12/2005 | Reiff .................... | F21K 9/65 362/184 |
| D568,515 S | 5/2008 | Liu | |
| 7,534,975 B1 | 5/2009 | Sharrah et al. | |
| D603,989 S | 11/2009 | Gardner et al. | |
| D612,086 S | 3/2010 | Brauer et al. | |
| D629,543 S | 12/2010 | Deguglimo et al. | |
| D637,748 S | 5/2011 | Caniparoli | |
| D643,561 S | 8/2011 | Maglica | |
| 8,545,040 B2 | 10/2013 | Berken | |
| 8,585,260 B2* | 11/2013 | Hajee .................. | F21S 9/032 362/190 |
| 8,662,699 B2 | 3/2014 | Tarter | |
| D716,981 S | 11/2014 | Hawthorne et al. | |
| D717,480 S | 11/2014 | Hsu et al. | |
| D719,286 S | 12/2014 | Inskeep | |
| 8,939,601 B1* | 1/2015 | Lee ..................... | F21L 4/00 362/162 |
| D748,837 S | 2/2016 | Cacciabeve | |
| D772,455 S | 11/2016 | Chen | |
| 9,500,322 B2 | 11/2016 | Watson et al. | |
| 9,689,544 B2 | 6/2017 | Green, Jr. et al. | |
| 9,709,247 B2 | 7/2017 | Man | |
| 9,713,216 B2* | 7/2017 | Urry ..................... | H05B 47/19 |
| D799,084 S | 10/2017 | Wu | |
| 9,909,744 B2 | 3/2018 | Pontano et al. | |
| 9,927,077 B1 | 3/2018 | Fowkes et al. | |
| D817,528 S | 5/2018 | Wu | |
| 10,030,855 B1 | 7/2018 | Khubani | |
| 10,036,543 B2 | 7/2018 | Ostrander | |
| D843,038 S | 3/2019 | Vyvey | |
| 10,371,326 B2* | 8/2019 | Grandadam .......... | H05B 45/10 |
| 10,393,326 B2* | 8/2019 | Inskeep ............... | F21V 23/0414 |
| 10,598,319 B2* | 3/2020 | Grandadam ........ | H05B 47/175 |
| 2002/0136005 A1 | 9/2002 | Lee | |
| 2006/0133074 A1 | 6/2006 | Lai | |
| 2009/0135611 A1* | 5/2009 | Lin ...................... | F21L 4/04 362/372 |
| 2009/0154148 A1 | 6/2009 | Meyer et al. | |
| 2011/0204818 A1 | 8/2011 | Spartano | |
| 2012/0069165 A1 | 3/2012 | Choi et al. | |
| 2013/0258645 A1 | 10/2013 | Weber et al. | |
| 2014/0140050 A1 | 5/2014 | Wong et al. | |
| 2015/0267902 A1 | 9/2015 | Zhang | |
| 2015/0372357 A1 | 12/2015 | Kruglak et al. | |

OTHER PUBLICATIONS

Promier, Promier LED Dimmable Lantern Green, Amazon, Mar. 3, 2016, 4 pages.

Promier, Promier LED Lantern and Flashlight Bundle Blue, Amazon, Mar. 3, 2016, 4 pages.

Promier the Evolution Light, Promier Expandable & Collapsible Task Light Super Bright COB LED Technology—Batteries Included, Amazon, Mar. 24, 2016, 4 pages.

Apollo's Products, LitezAll 200 Lumens Easy Pull Open COB LED Lantern/for Camping, Workshops, Home, Cabin, or Outbuildings (Red), Amazon, Mar. 29, 2017, 5 pages.

Apollo's Products, 1000 Lumen LED Lantern/Camping, Workshops, Home, Cabin, or Anywhere that light is needed (Good for Extreme Cold or Heat) (100% Manufacture Replacement Guarantee) Authorized Promier Dealer, Amazon, Mar. 29, 2017, 7 pages.

Apollo's Products, LitezAll 1750 Lumen COB LED Camping Lantern/Workshops, Home, Cabin, or Anywhere (115 hrs Alkaline Batteries) 100% Manufacture Guarantee, Amazon, Mar. 29, 2017, 7 pages.

Apollo's Products, 225 Lumens Lantern 2 Panel COB Adjustable/ Dimable LED for Camping, Workshops, Home, Cabin, or Outbuildings (100% Manufacture Replacement Guarantee) (Gray), Amazon, Mar. 30, 2017, 6 pages.

\* cited by examiner

PORTABLE LANTERN LIGHT WITH MULTIPLE OPERATING MODES

CROSS-REFERENCE TO RELATED APPLICATIONS

This application is a continuation of U.S. patent application Ser. No. 16/531,938, filed Aug. 5, 2019, to be issued as U.S. Pat. No. 10,598,938, which is a continuation of U.S. Pat. No. 10,371,326, which is a continuation-in-part of Ser. No. 29/614,796, filed on Aug. 23, 2017 and which claims the benefit of Provisional Patent Application No. 62/549,247, which applications are incorporated in their entirety herein by reference and made a part hereof.

FEDERALLY SPONSORED RESEARCH OR DEVELOPMENT

N/A

TECHNICAL FIELD

This disclosure relates to a portable lantern light with a central battery that has multiple operating modes and multiple mounting configurations. In particular, the portable lantern light includes one or more light-emitting elements selectively operable among a plurality of modes.

BACKGROUND OF THE INVENTION

Existing lighting products enables a wide range of indoor, outdoor and nighttime activities. Electronic lighting is typically provided from fixed installations (e.g., a roof, a wall, or ceiling), where a light source receives electrical power from a fixed and wired power source. Such lighting is useful in illuminating a particular area, but lacks the flexibility of a portable lighting source. Internally-powered portable lighting sources have been developed to provide illumination in varied locations and situations. However, such internally-powered portable lighting sources are not optimized for size, durability, form-factor, illumination flexibility and mounting flexibility parameters. Further, portable lighting sources are also not optimized to provide illumination both in fixed locations and in varied locations.

Accordingly, there is an unmet need for a portable light optimized for durability and to provide a variety of illumination modes and mounting configurations. A full discussion of the features and advantages of the present invention is deferred to the following detailed description, which proceeds with reference to the accompanying drawings.

SUMMARY OF THE INVENTION

In some implementations, the present disclosure provides a portable lantern light that features a plurality of lighting elements, an internal power source, a mode selector for selecting among various operating modes, a luminosity selector for selecting among various lighting element brightness levels, a magnet, a securement member selectively positionable among multiple configurations, and a retractable stabilization assembly.

Other features and advantages of the invention will be apparent from the following specification taken in conjunction with the following drawings.

BRIEF DESCRIPTION OF THE DRAWINGS

The drawing figures depict one or more implementations in accord with the present teachings, by way of example only, not by way of limitation. In the figures, like reference numerals refer to the same or similar elements.

Figure 1:
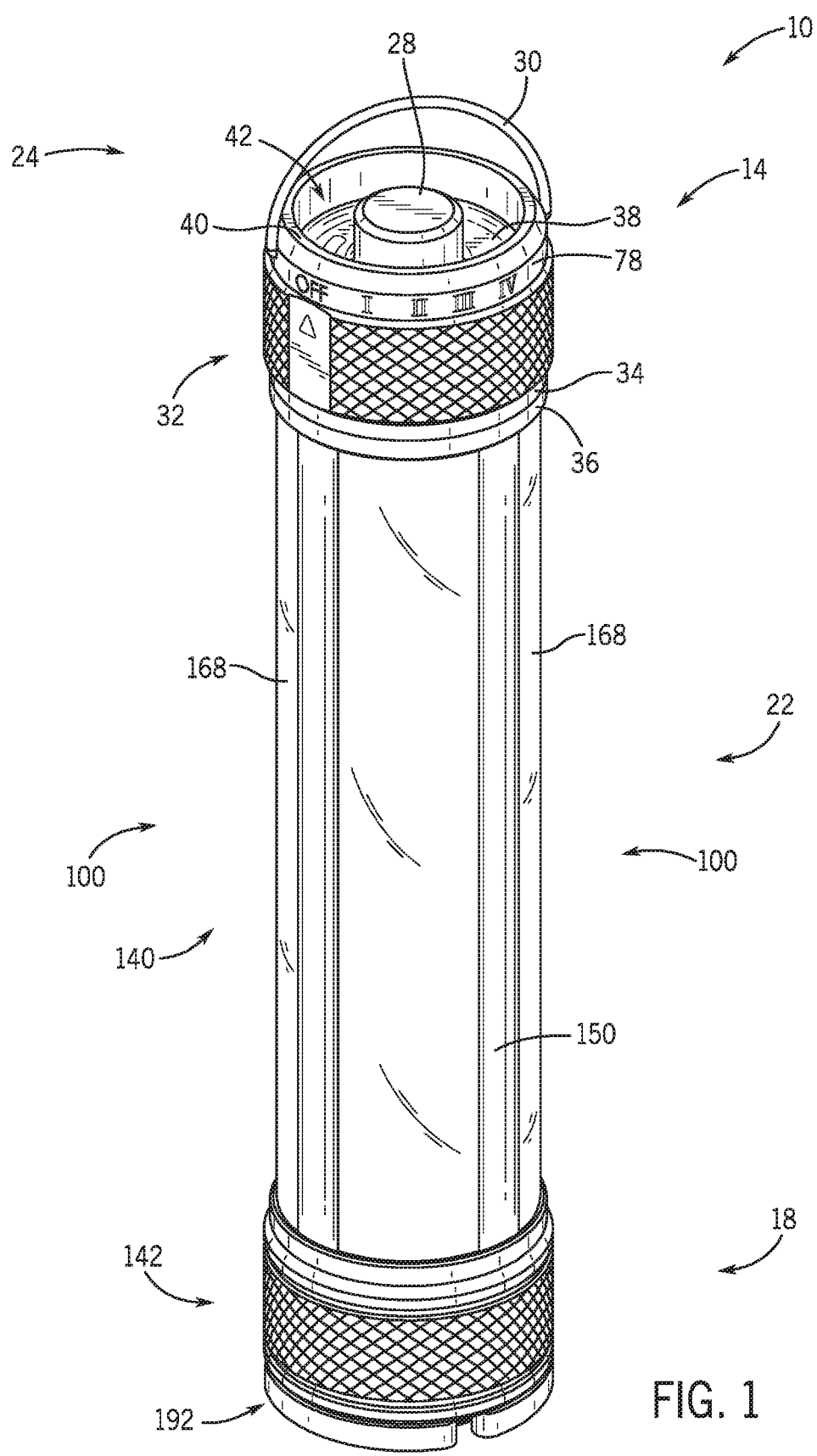
FIG. 1 is a top perspective view of a first embodiment of a portable light, showing a stabilization assembly in a retracted position and a securement member in a deployed position.

While the invention will be described in connection with the preferred embodiments shown herein, it will be understood that it is not intended to limit the invention to those embodiments. On the contrary, it is intended to cover all alternatives, modifications, and equivalents, as may be included within the spirit and scope of the invention as defined by the appended claims.

DETAILED DESCRIPTION

While this disclosure includes a number of details and implementations in many different forms, there is shown in the drawings and will herein be described in detail particular implementations with the understanding that the present disclosure is to be considered as an exemplification of the principles of the disclosed methods and systems, and is not intended to limit the broad aspects of the disclosed concepts to the implementations illustrated.

As shown in the Figures and explained below, a portable light or lantern 10 features a multitude of brightness or luminosity settings and a distinct operating modes, both independently selected by a user. The portable light 10 can be carried or mounted using a plurality of mounting configurations (e.g., on a flat support surface 44) in order to provide flexible illumination solutions to the user. The multiple operating modes and the multiple mounting configurations provide the portable light 10 with increased flexibility and greater utility, as compared to conventional lanterns or flashlights.

With reference to the Figures, the potable light 10 includes: (i) a luminosity selector assembly 28, (ii) an operating mode selector assembly 32, (iii) a plurality of lighting elements 100, (iv) a power source 134 disposed between the lighting elements 100, and (v) and retractable stabilization assembly 192. As discussed in greater detail below, the luminosity selector assembly 28 and the mode selector assembly 32 allow the user to independently change the operation mode and the brightness or lumen output level of the portable light 10. These assembles 28, 32 operate independent of each other, where the user: (i) selects at least one lighting element 100 to be illuminated using the mode selector assembly 32 and (ii) moves the luminosity selector assembly 28 from an "Off" position to an "On" position. Specifically, the luminosity selector assembly 28 allows the user to set the brightness or lumen output level of the lighting element(s) 100, such that the luminosity selector assembly 28 functions as a dimmer for the portable light 10. This dimming function allows the user to select a brightness level or lumen output from the portable light 10, which is between a first predetermined minimum level and a second predetermined maximum level. The mode selector assembly 32 allows the user to select the operating mode of the portable light 10. In particular, the mode selector assembly 32 allows the user to select the number of lighting elements 100 to be illuminated. For example, the user may select one of the lighting elements 100 or a plurality of lighting elements 100 for illumination.

As generally shown in FIGS. 8-11, the portable light 10 also has a power source 134 that is disposed within the intermediate section 22 and thus radially inward of the lighting elements 100. The power source 134 may be a combination of removable non-rechargeable batteries 278 disposed within a battery cartridge 250. As discussed in greater detail below, the configuration of the power source 134 allows it to supply power to the portable light 10 regardless of which direction the power source 134 is inserted within the portable light 10.

Figure 2:
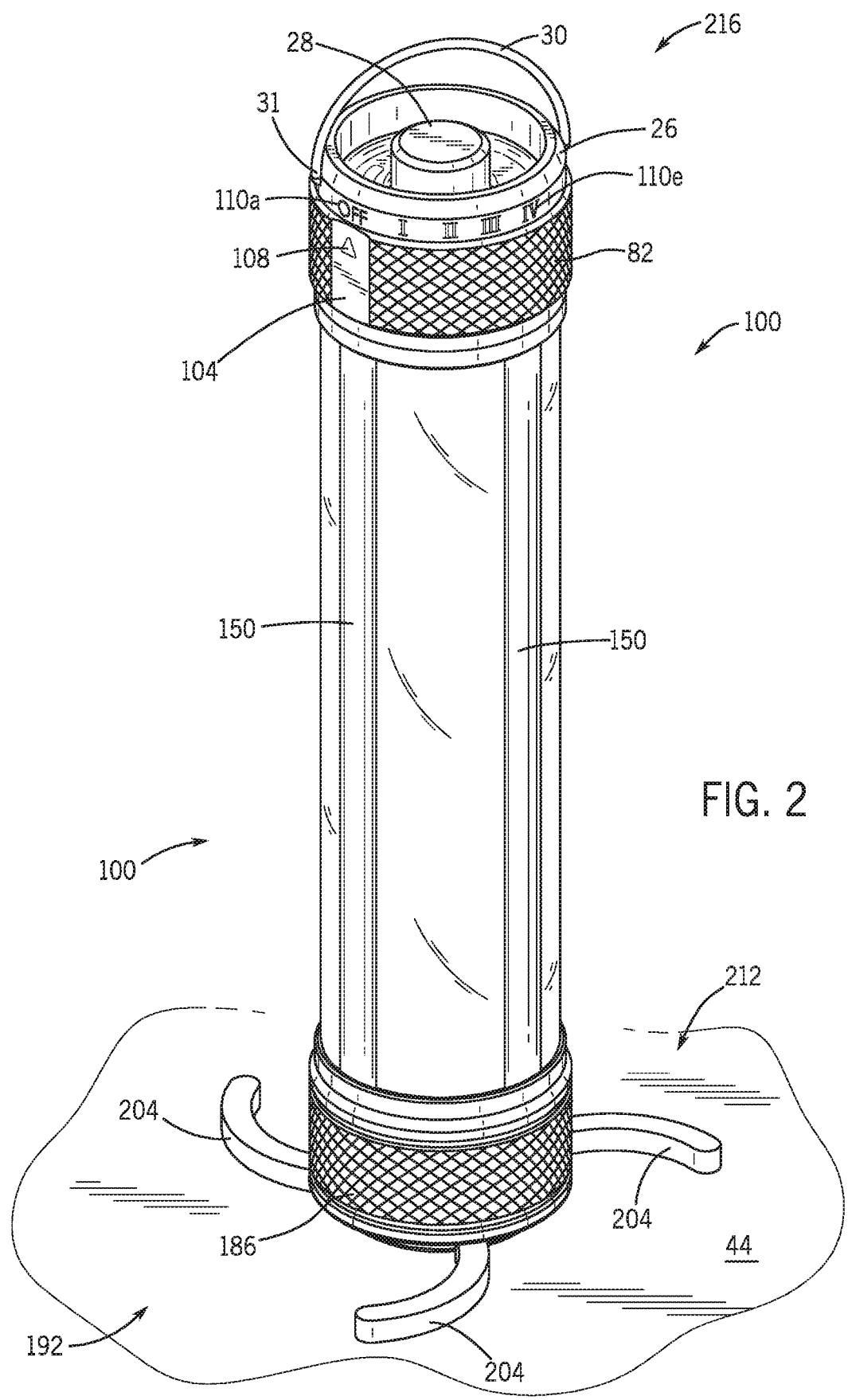
FIG. 2 is a top perspective view of the portable light source of FIG. 1, wherein the portable light is resting on a support surface with both the stabilization assembly and the securement member in a deployed position.
Figure 3:
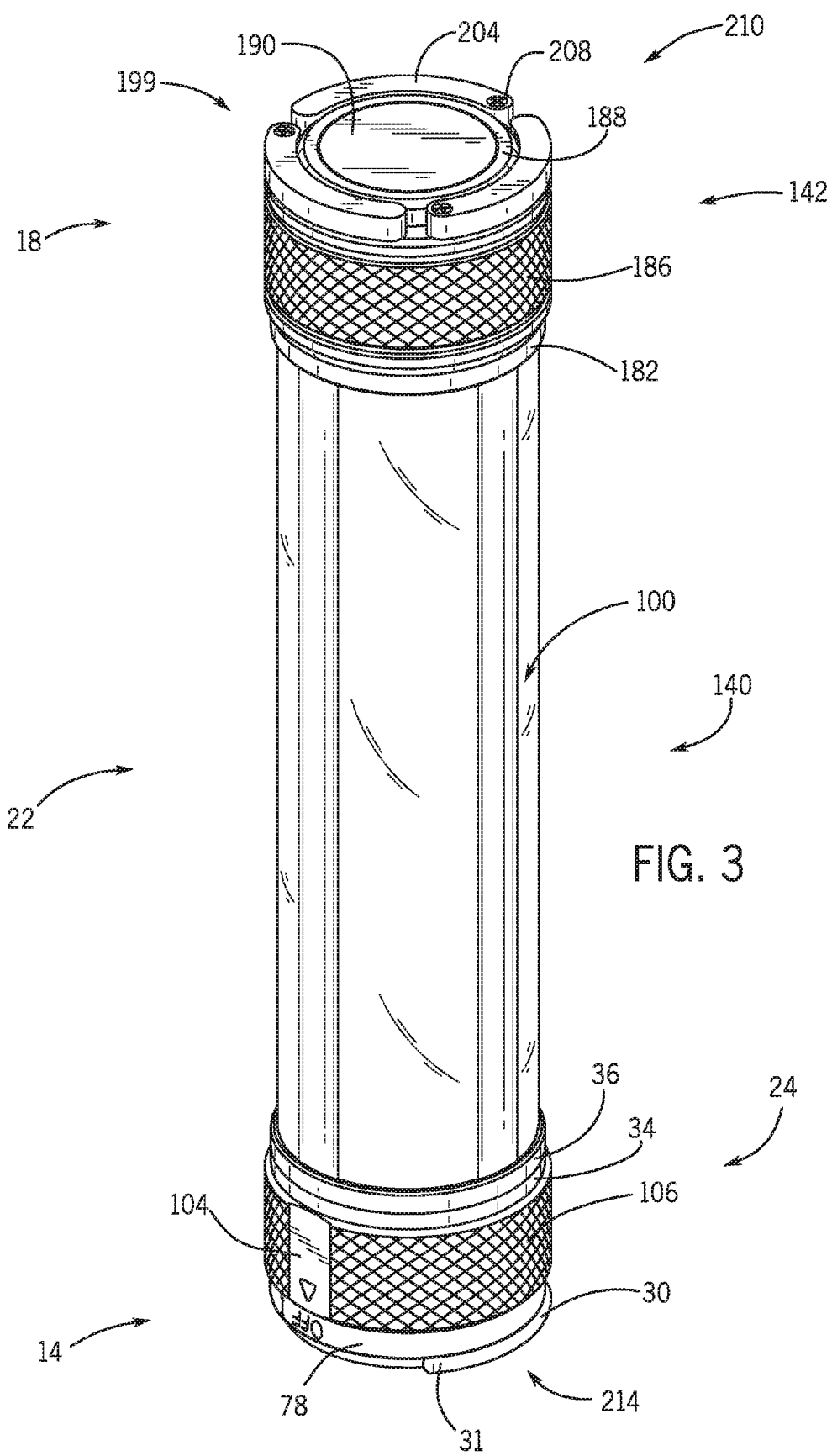
FIG. 3 is a bottom perspective view of the portable light of FIG. 1, wherein both the stabilization assembly and the securement member are in the retracted position.
Figure 4:
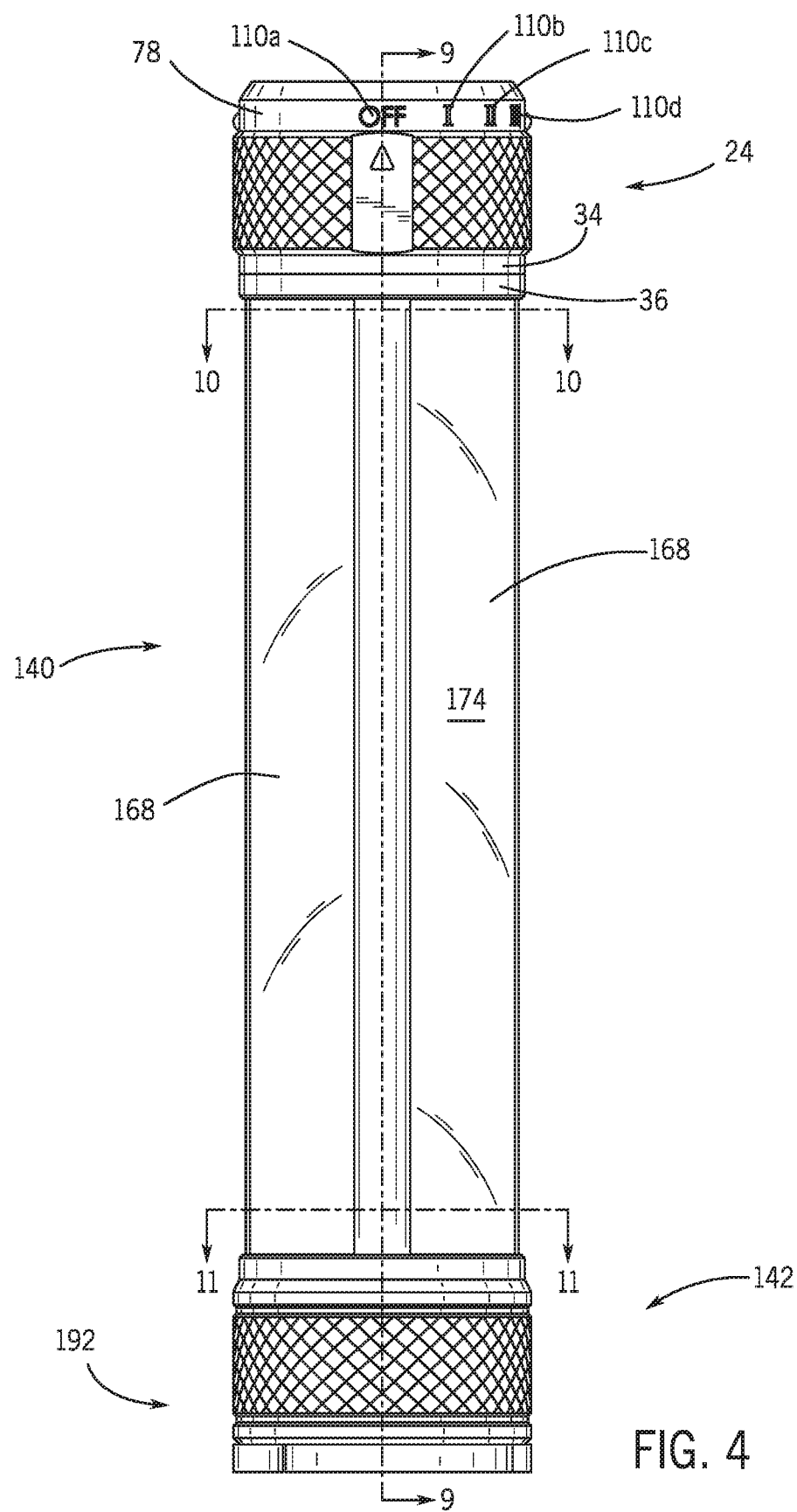
FIG. 4 is a front view of the portable light of FIG. 1, wherein both the stabilization assembly and the securement member are in the retracted position.
Figure 5:
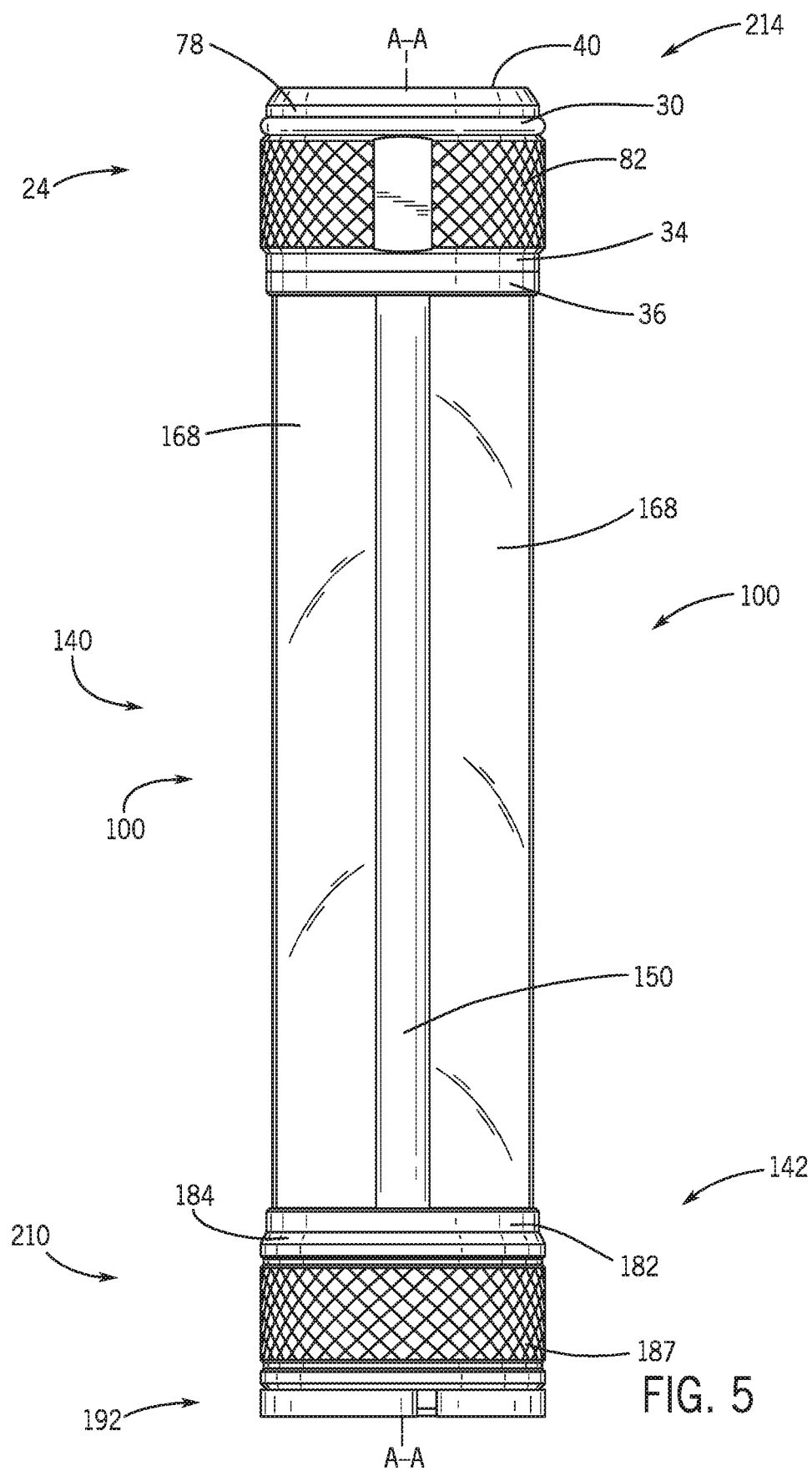
FIG. 5 is a rear view of the portable light of FIG. 1, wherein both the stabilization assembly and the securement member are in the retracted position.

The portable light 10 further has multiple mounting configurations for use in different environments and under different conditions. For example, the user can move the securement member 30 to a deployed position 214, as best shown in FIGS. 1 and 2, where upon the user can then hang the portable light 10 via the deployed securement member 30 to an object or fixture (e.g., a hook) disposed above the portable light 10. Second, the user may releasably attach the magnet 190 residing within the lower end 18 to a magnetic surface or object. Thus, the portable light 10 will be magnetically mounted, to a selected magnetic surface or object at any orientation (e.g., to a tool box or to a metal surface of a vehicle). Third, the user may place the bottom surface 199 of the portable light 10 on a surface support surface 44 and deploy a retractable stabilization assembly 192 (see FIG. 2). Fourth, the user may manually carry the portable light 10 for portable illumination use as a flashlight or lantern between various locations.

Figure 9:
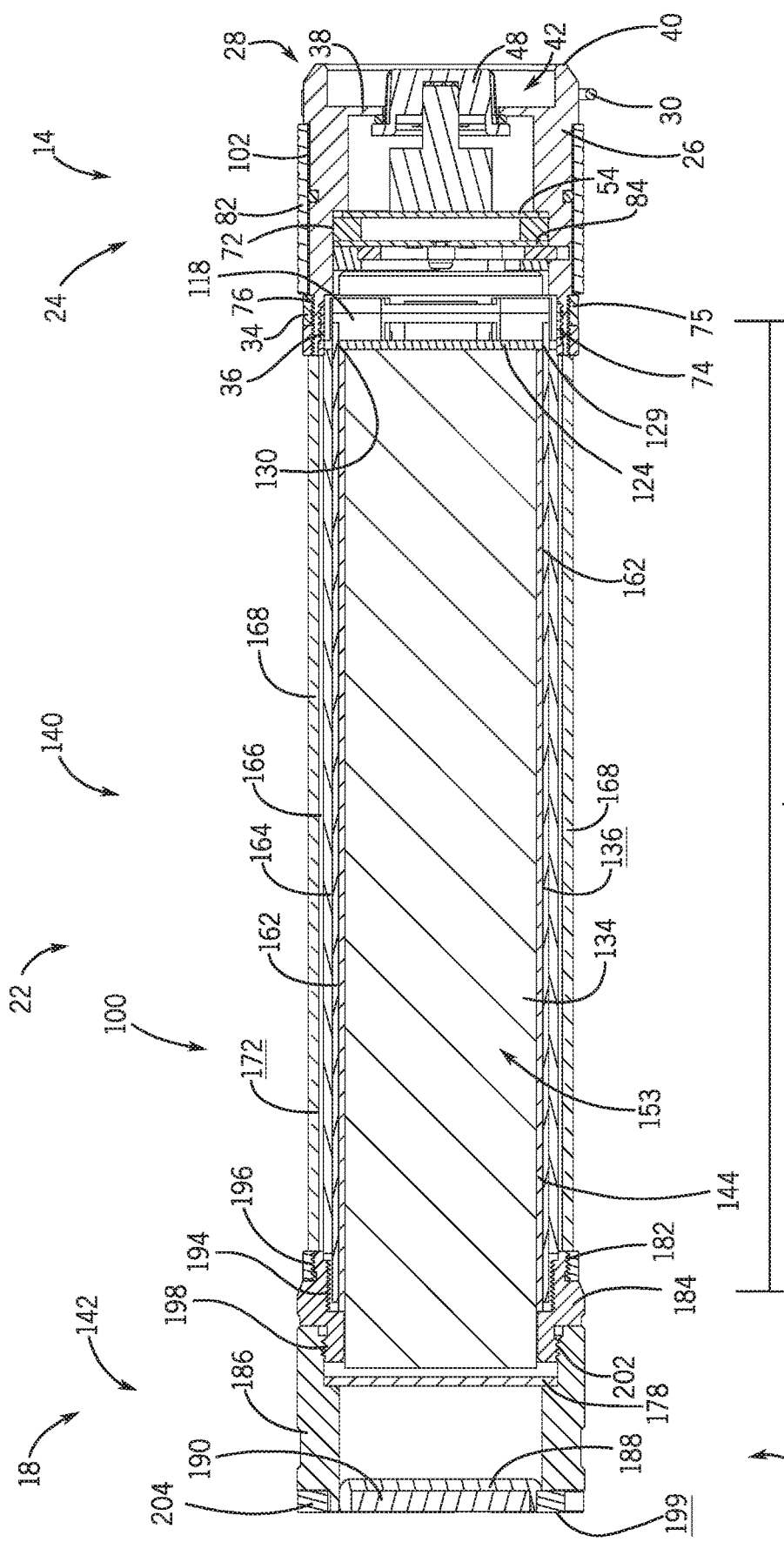
FIG. 9 is a cross-sectional view of the portable light of FIG. 1 taken along the 9-9 line shown in FIG. 4.
Figure 9A:
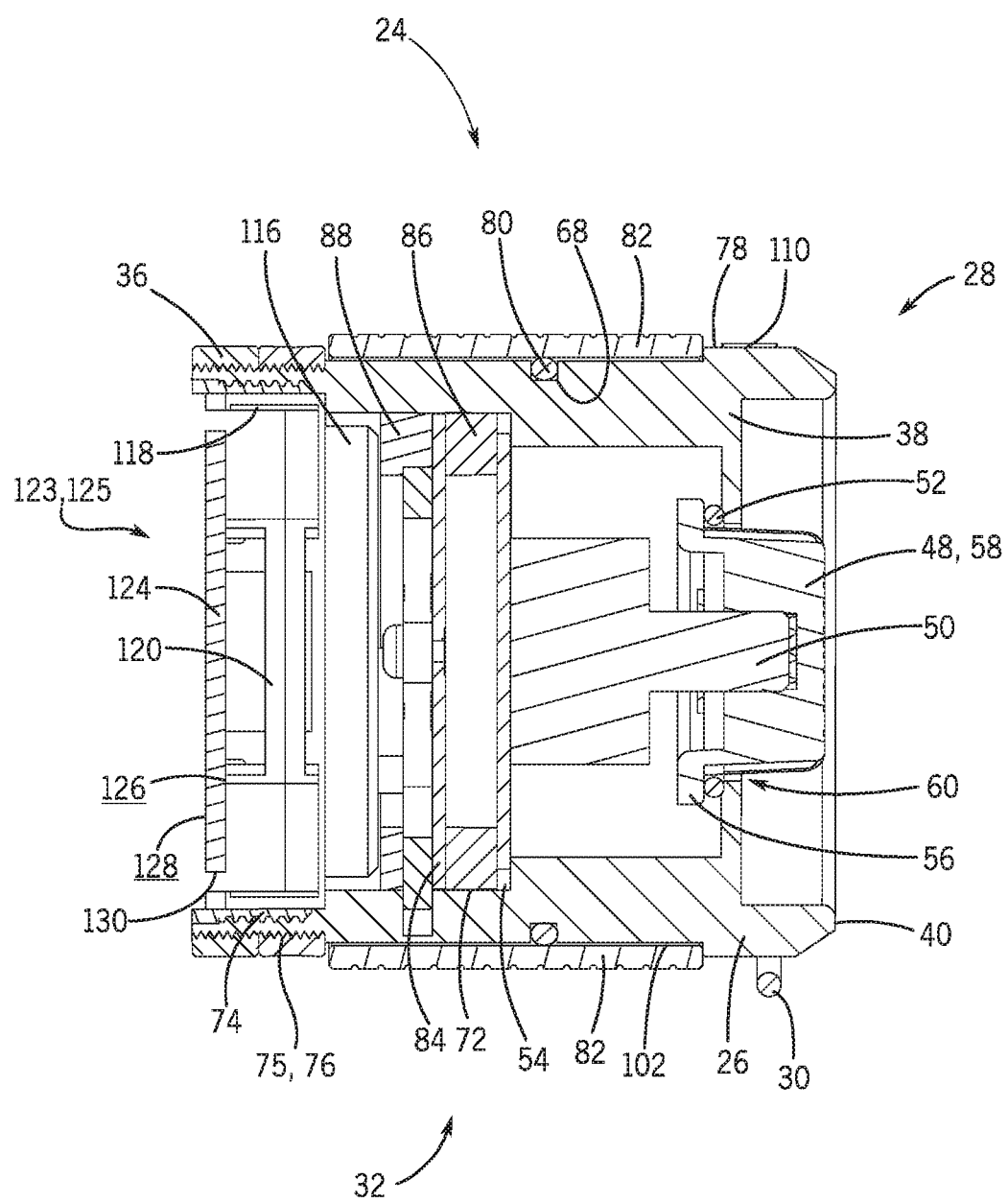
FIG. 9A is an enlarged cross-sectional view of the first end assembly of the portable light of FIG. 1 taken along the 9-9 line shown in FIG. 4.

In the embodiment of FIGS. 1-12, the portable light 10 has an elongated configuration with a first end assembly 24 that is operably connected to the first end 14 of the portable light 10. The first end assembly 24 allows the user to change the operating mode and the brightness of the portable light 10 by changing the positions of the luminosity selector assembly 28 and mode selector assembly 32. Referring to FIGS. 1-5, the first end assembly 24 includes: (i) a top or upper housing 26, (ii) the luminosity selector assembly 28, (iii) the securement member 30, (iv) the mode selector assembly 32, and (v) connector rings 34, 36. The upper housing 26 has an end wall 38 that is inwardly recessed from an outer rim 40 to form a recess 42. An extent of the luminosity selector assembly 28 is positioned within the recess 42. Referring to FIG. 9, the luminosity selector assembly 28 preferably does not extend beyond the outer rim 40, which helps protect the luminosity selector assembly 28 from making contact with a support surface 44, if the portable light 10 is dropped or knocked over by the user. In addition, this configuration allows the outer rim 40 to make contact with a support surface 44 without interruption by the luminosity selector assembly 28, which in turn allows the portable light 10 to be stable, if the outer rim 40 is placed in contact with the support surface 44.

Figure 13:
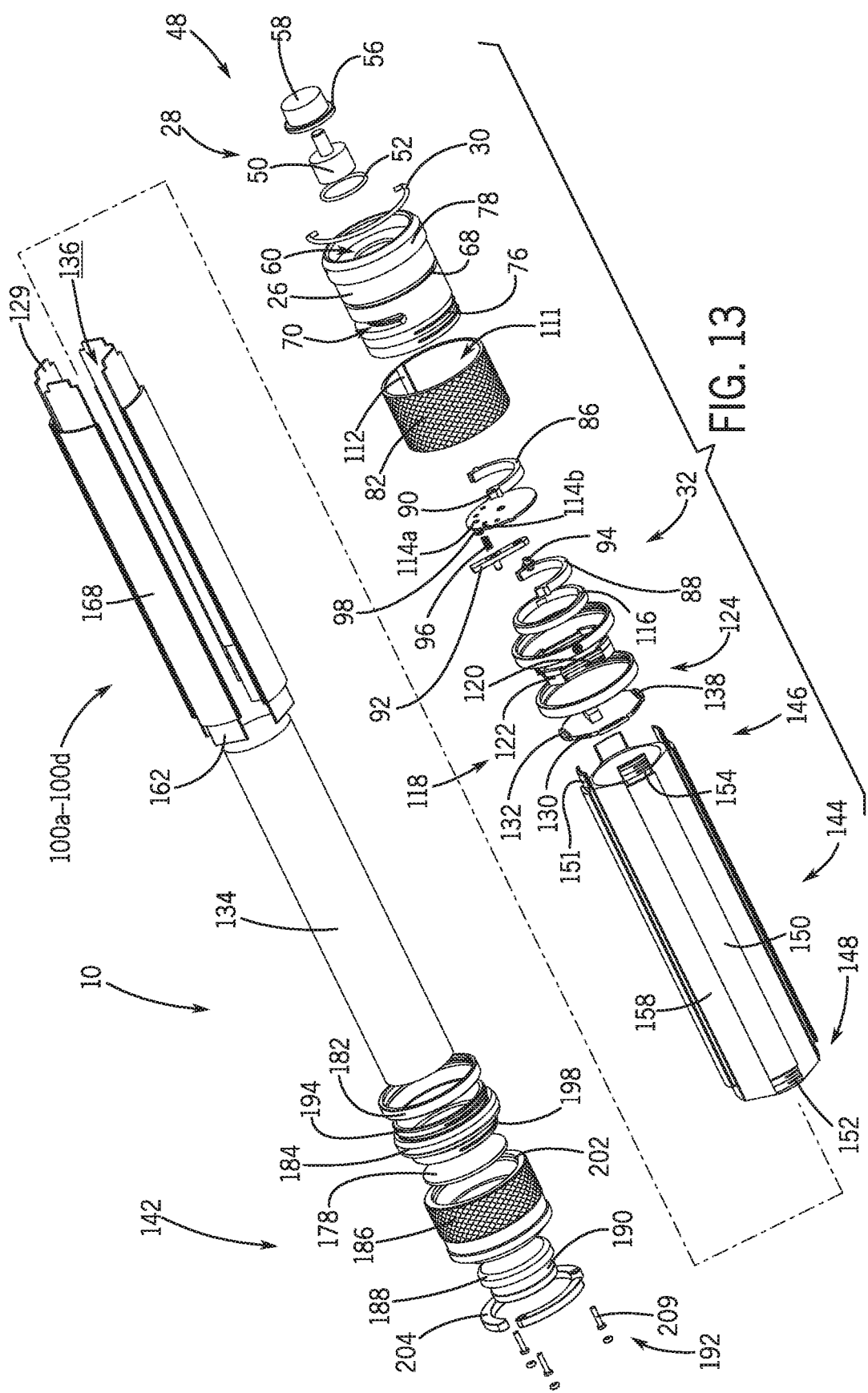
FIG. 13 is an exploded view of the portable light shown in FIG. 1.

As mentioned above, the luminosity selector assembly 28 functions as a dimmer for the portable light 10. This dimming function allows the user to select a brightness level or lumen output from the lighting elements 100, which is between a first predetermined minimum level (e.g., 20 lumen) and a second predetermined maximum level (3,000 lumen). In the embodiment of the Figures, the luminosity selector assembly 28 is a rotary dial 46 that includes: (i) a cap 48, (ii) a selector 50, (iii) an o-ring 52, and (iv) a luminosity printed circuit board ("PCB") 54. Referring to FIGS. 9 and 13, the cap 48 includes a flange 56 and a projection 58 that extends radially from the flange 56. The cap 48 is configured such that the projection 58 extends through a hole 60 formed in the end wall 38, while the flange 56 resides below or within the end wall 38. This configuration helps to ensure that when an upwardly directed force that is applied to the cap 48, the cap 48 cannot be removed from the portable light 10. The o-ring 52 is positioned between the flange 56 and the end wall 38, which helps to ensure the smooth operation of the rotary dial 46 along with protecting the internal electronics from exterior moisture.

The cap 48 is operably coupled to the selector 50, which in turn is operably coupled to the luminosity PCB 54. Thus, when the cap 48 is rotated by a user, the selector 50 is also rotated. This angular movement of the cap 48 and the selector 50 changes the state of the luminosity PCB 54, which in turn changes the current that may be applied to the lighting elements 100 during operation of the light 10. This change in current alters the lumen output of the lighting elements 100. For example, the rotary dial 46 may be rotated counter-clockwise until it stops. In this "OFF" position, the luminosity PCB 54 applies zero electrical current to the lighting elements 100. As the rotary dial 46 is rotated in a clockwise direction from this "OFF" position, the luminosity PCB 54 allows for the application of a greater amount of electrical current to the lighting elements 100. This in turn increases the possible lumen output of the lighting elements 100 (assuming the mode selector assembly 32 is not in the "Off" position).

Figure 14:
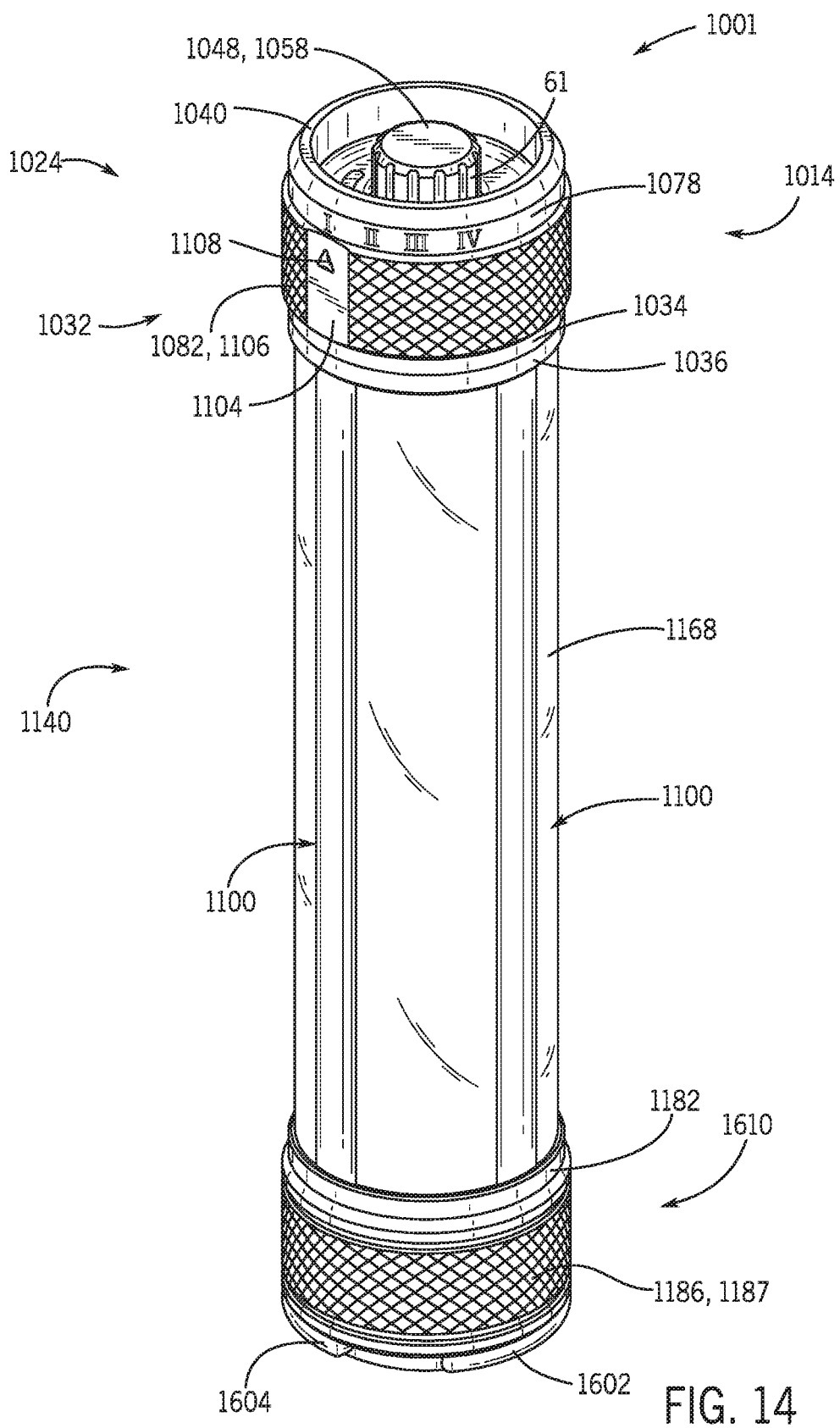
FIG. 14 is a top perspective view of a second embodiment of a portable light, showing a securement assembly in a retracted position.
Figure 15:
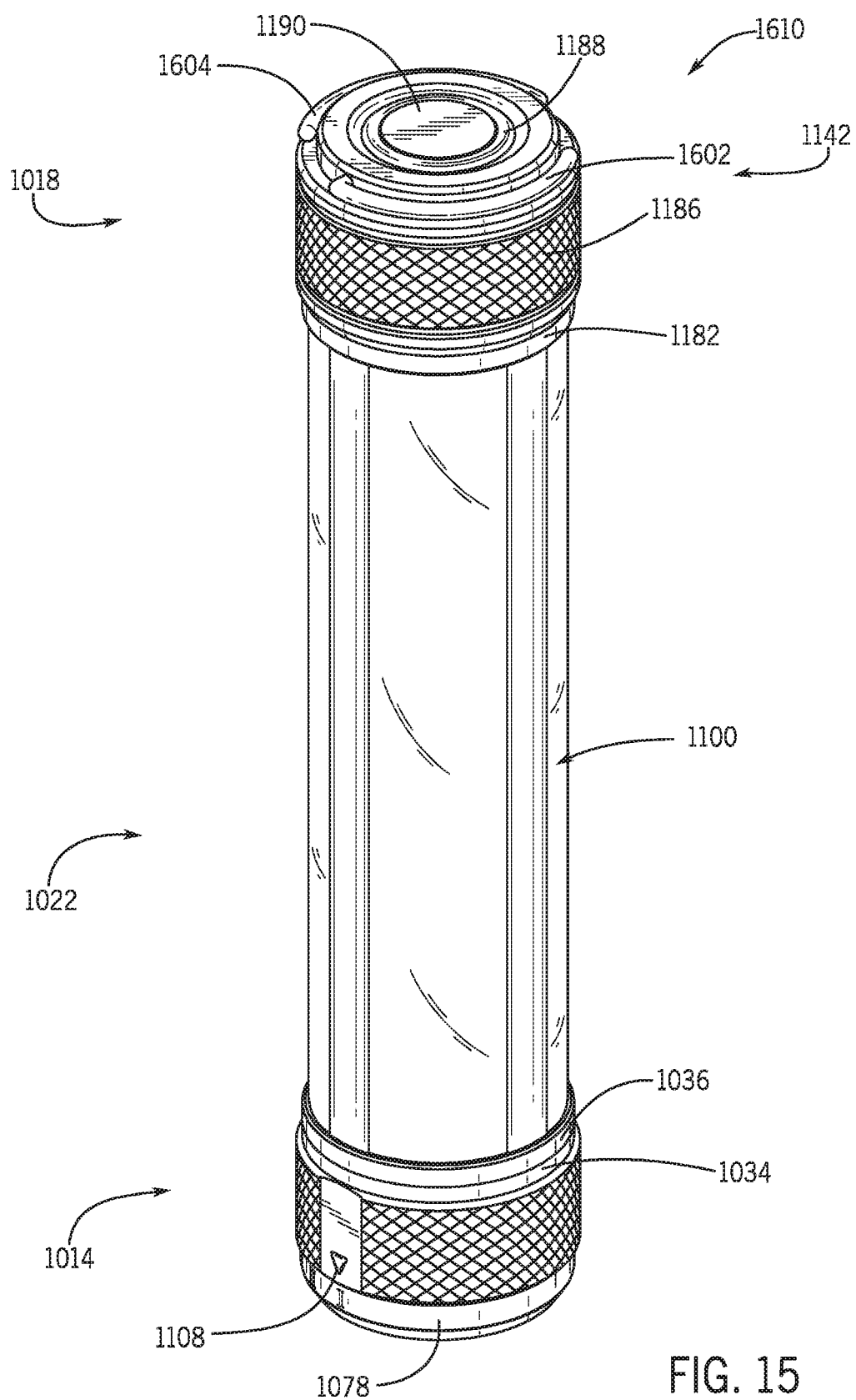
FIG. 15 is a bottom perspective view of the portable light of FIG. 14, wherein the securement assembly is in the retracted position.
Figure 16:
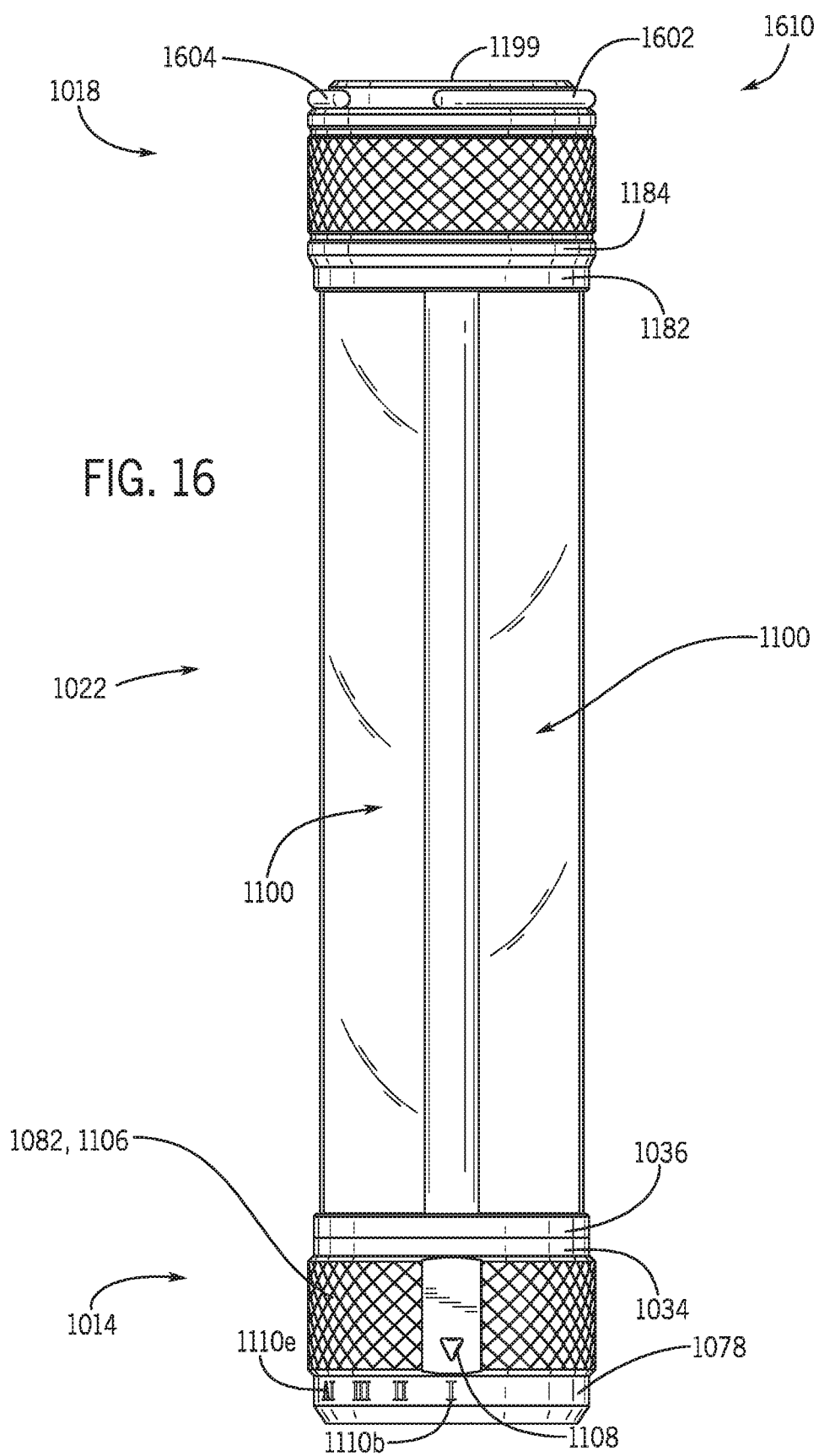
FIG. 16 is a front view of the portable light of FIG. 14, wherein the securement assembly is in the retracted position.
Figure 17:
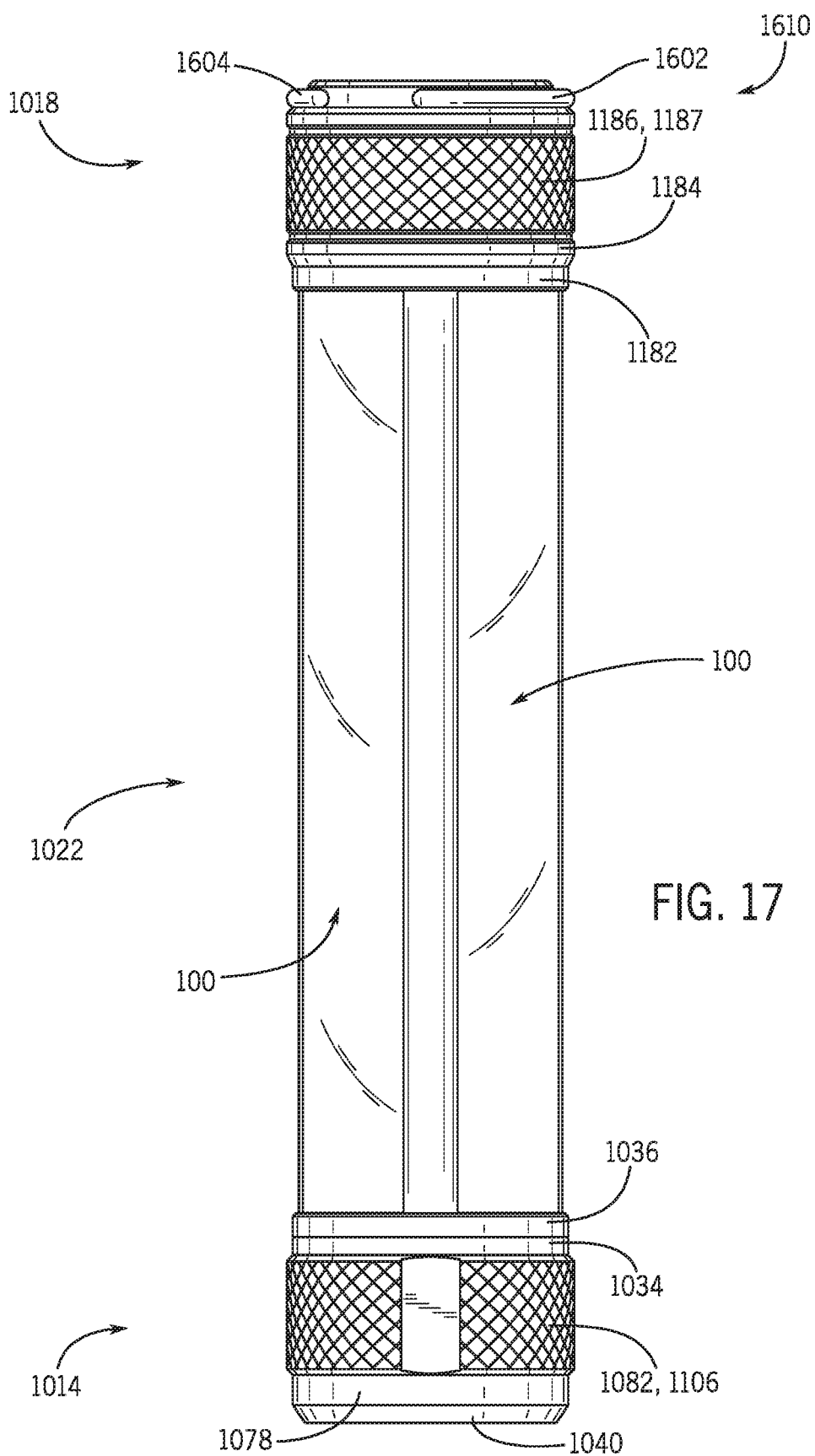
FIG. 17 is a rear view of the portable light of FIG. 14, wherein the securement assembly is in the retracted position.
Figure 18:
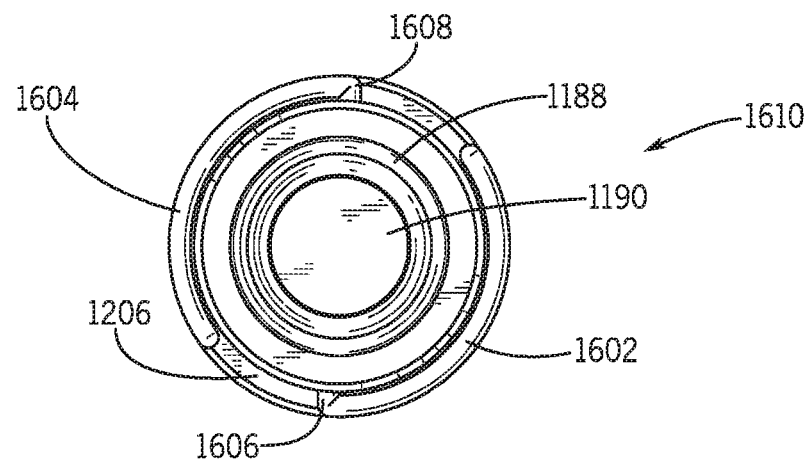
FIG. 18 is a bottom view of the portable light of FIG. 14, wherein the securement assembly is in the retracted position.
Figure 19:
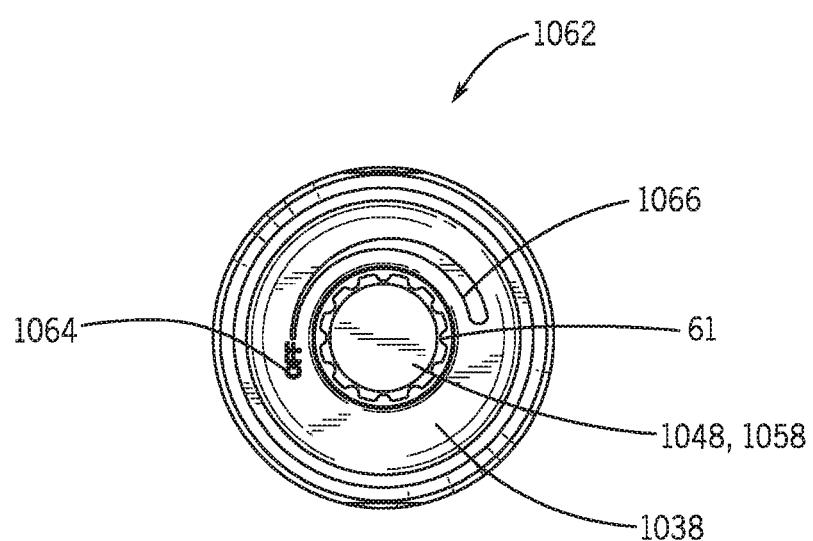
FIG. 19 is a top view of the portable light of FIG. 14, wherein the securement assembly is in the retracted position.
Figure 20:
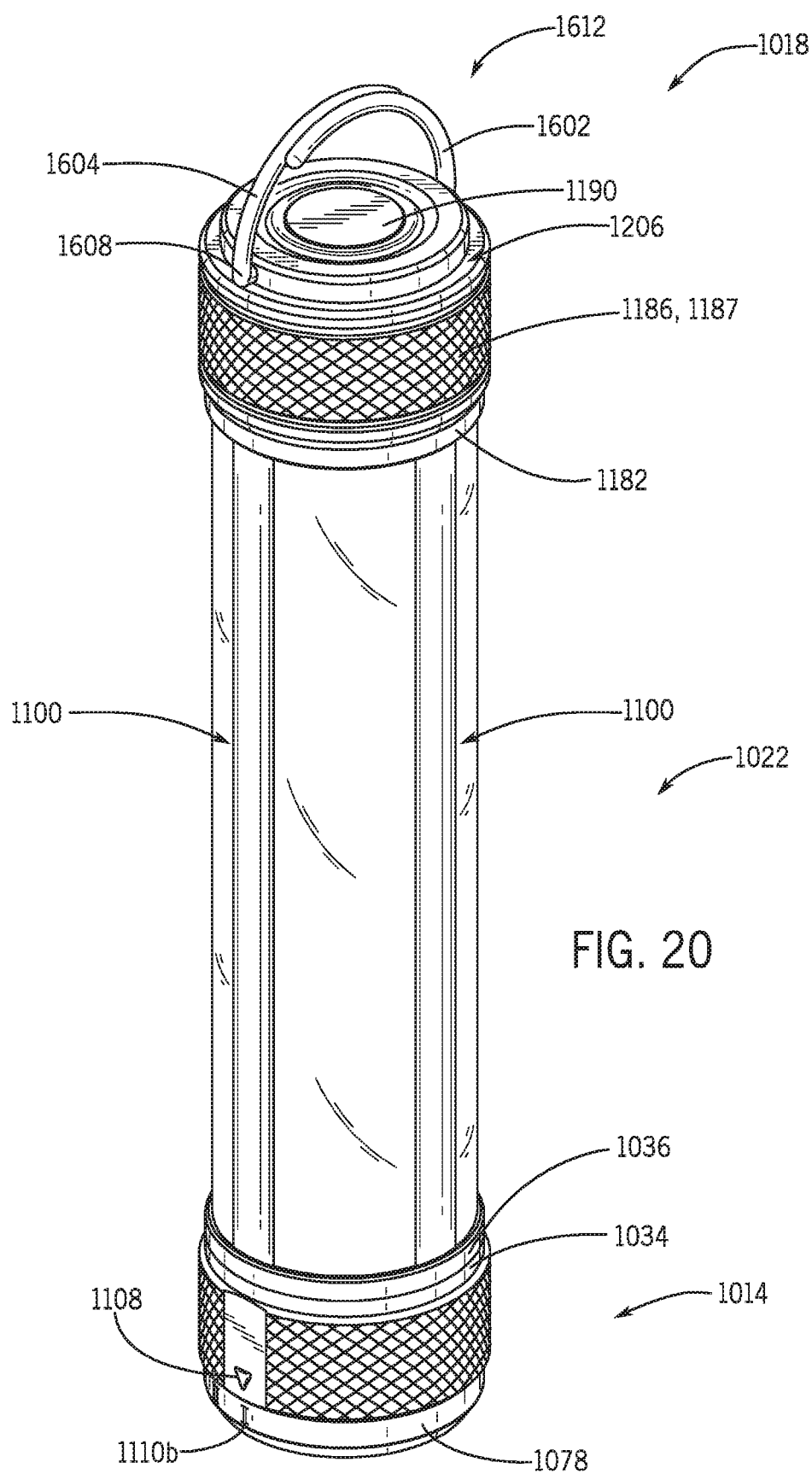
FIG. 20 is a bottom perspective view of the portable light of FIG. 14, showing the securement assembly is in a deployed position.

In some embodiments (see FIGS. 14 and 19) the rotary dial 46 may include dial grooves 61 or another type of textured surface to enhance a user's grip when rotating the rotary dial 46. In an alternative embodiment, the luminosity selector assembly 28 may have multiple predetermined lumen output levels. For example, the luminosity selector assembly 28 may be set to a first or "OFF" position, a second or "Low" position, a third or "Medium" position, and a fourth or "High" position. It should be understood that the luminosity selector assembly 28 may have other mechanical or electrical configurations, which may further its ability to function as a dimmer for the portable light 10.

It is to be understood that the luminosity selector assembly 28 can be replaced with an assembly that is configured to utilize one or more buttons, switches, sliders, local sensors (e.g., motion, light, sound, heat, motion), or other types of electrical selection devices. In one embodiment, the rotary dial 46 and its associated circuitry may be replaced by a button and the necessary circuitry to allow a user to illuminate or turn "On" the portable light 10 upon depressing the button and to un-illuminate or turn "Off" the portable light 10 upon depressing the button another time after the portable light 10 is in an illuminated state. In another alternative embodiment, the rotary dial 46 and its associated circuitry may be replaced by a button and the necessary circuitry to allow a user to either: (i) press the button a first time to illuminate or turn "On" the portable light 10, (ii) press and hold the button to illuminate and adjust the brightness of the portable light 10, or (iii) press the button another time after the portable light 10 is illuminated to un-illuminate or turn "Off" the light 10. Additionally, the luminosity selector assembly 28 may be remotely located from the portable light 10. For example, the luminosity selector assembly 28 may be located on a remote wireless device, such as the remote devices described in U.S. patent application Ser. No. 15/812,852, filed on May 17, 2018, and which is fully incorporated herein by reference. Another example of a remote wireless device includes a cellphone, laptop, RF remote control, or other devices that are connected to the portable light 10 via the internet (e.g., wireless camera, motion sensor, light sensor, timer, etc.).

Figure 6:
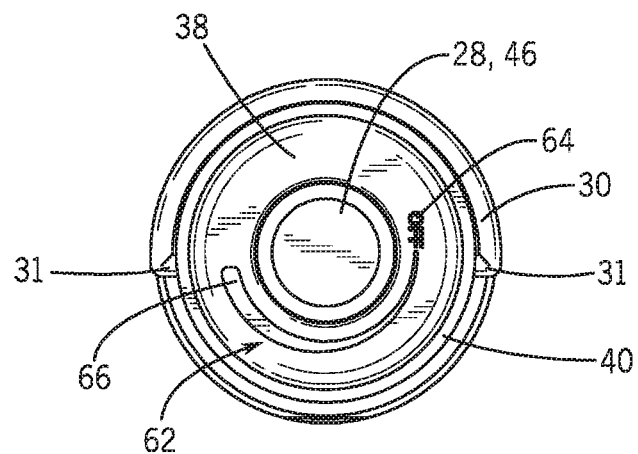
FIG. 6 is a top view of the portable light of FIG. 1, wherein both the stabilization assembly and the securement member are in the retracted position.
Figure 7:
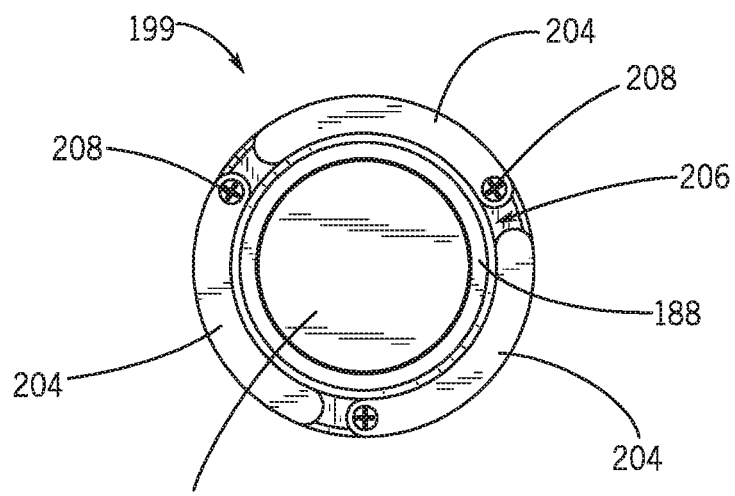
FIG. 7 is a bottom view of the portable light of FIG. 1, wherein both the stabilization assembly and the securement member are in the retracted position.
Figure 8:
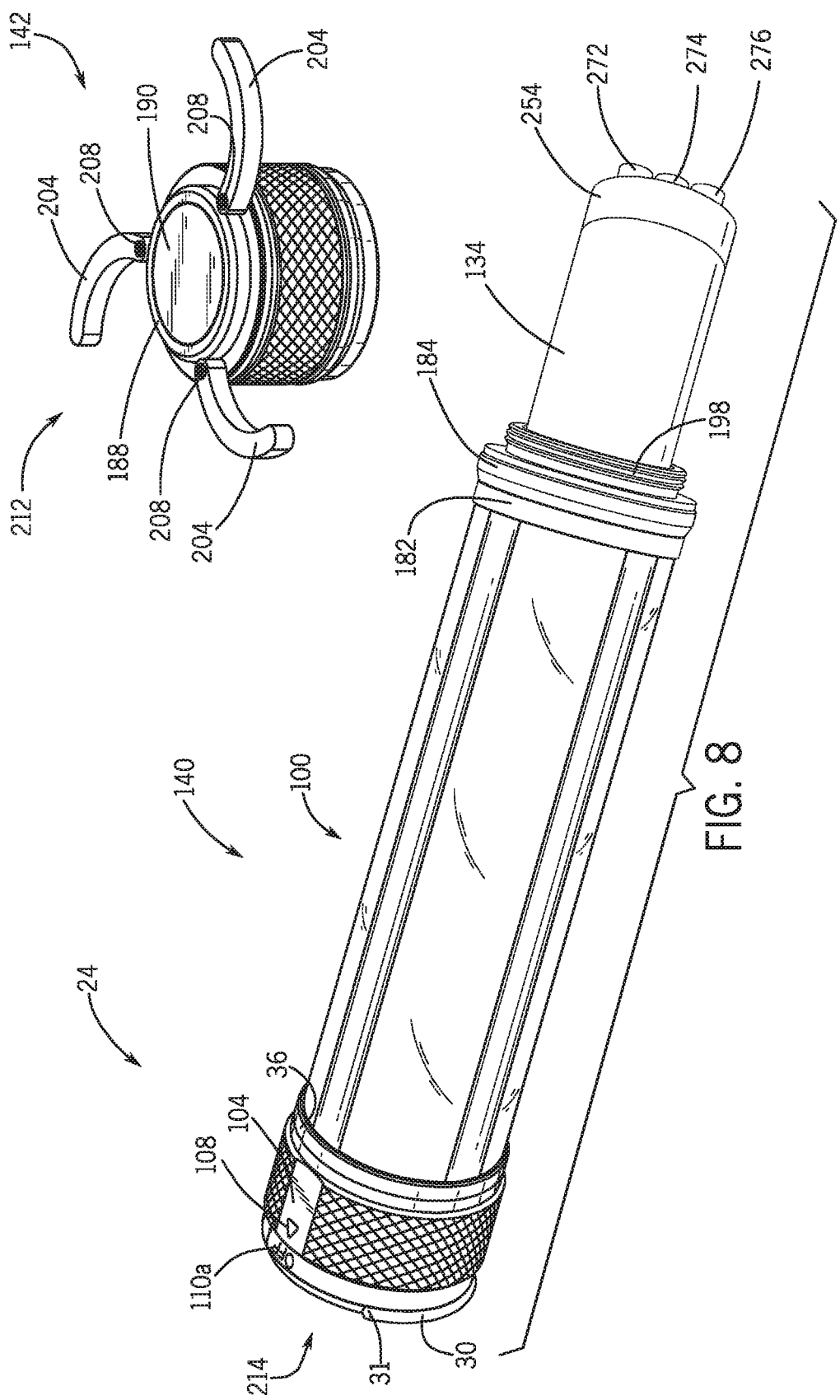
FIG. 8 is a perspective view of the portable light of FIG. 1, wherein the portable light is in a partially dissembled state.

As best shown in FIGS. 1 and 6, a luminosity indicator 62 may be disposed on the end wall 38 or the luminosity selector assembly 28. The luminosity indicator 62 contains visual information including shapes, letters or numbers for apprising a user of information regarding an operation of the luminosity selector assembly 28. In some implementations, as shown exemplarily in FIG. 6, the luminosity indicator 62 includes the word "OFF" 64 indicating zero luminosity, along with a visual image indicating progressively increased luminosity 66. In other embodiments, the luminosity indicator 62 may have multiple words (e.g., "OFF", "Low", "Medium", and "High"), may be made from a reflective material, can be a light emitting diode, or a TFT display.

The upper housing 26 also contains components that help position and secure the electrical components of the portable light 10 within the first end assembly 24. As best shown in FIGS. 1, 9 and 13, the upper housing 26 also includes: (i) a notch 68, (ii) mode selector aperture 70, (iii) a first set of internal threads 72, (iv) a second set of internal threads 74, (v) a first set of external threads 76, and (vi) a upper flange 78. The notch 68 receives an extent of an O-ring 80 that is positioned between the upper housing 26 and a mode selector ring 82 of the mode selector assembly 32. This configuration helps maintain spacing between the mode selector ring 82 and the outer surface of the upper housing 26 to ensure the smooth operation of the mode selector ring 82. The first set of internal threads 72 has a smaller internal diameter than the second set of threads 74, wherein the first set of internal threads 72 are configured to receive an extent of a luminosity PCB 54 and a mode selector PCB 84. This configuration allows for quick assembly of the portable light 10 and the replacement of the luminosity PCB 54 or the mode selector PCB 84, if either one of these PCBs are damaged. The first set of external threads 76 are configured to receive the internal threads 75 of the connector rings 34, 36. As will be described in greater detail below, the mode selector PCB 84 helps control which of the lighting elements 100 is illuminated.

The first end assembly 24 also includes a first spacer 86 and a second spacer 88, which are located adjacent to the luminosity PCB 54 or the mode selector PCB 84. These spacers 86, 88 allow clearance between: (i) moving parts contained within the first end assembly 24 and (ii) the circuit components (e.g., capacitors, resistors, microprocessor, and etc.) that are operably coupled to the PCBs 54, 84. Specifically, the first and second spacers 86, 88 only extend partially around the perimeter of the mode selector PCB 84 to ensure that they do not interfere with the moving parts of the first end assembly 24. The first and second spacers 86, 88 also have projections 90 that align with recesses that are formed in interior of the first end assembly 24. These projection 90 help ensure the proper positioning of the PCBs 54, 84 and other components within the first end assembly 24.

Figure 23:
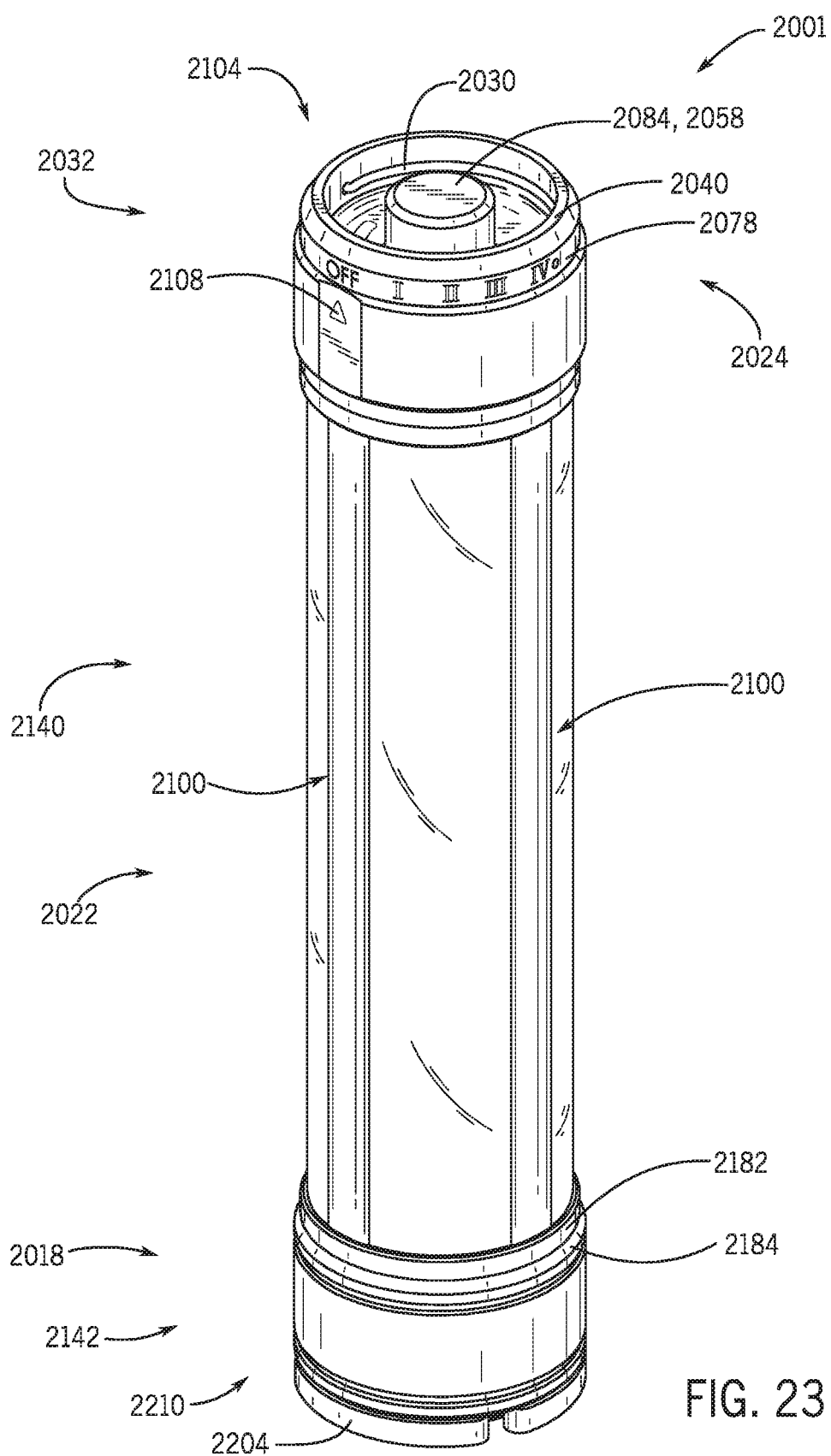
FIG. 23 is a top perspective view of a third embodiment of a portable light, showing a stabilization assembly in a retracted position and a securement member in a retracted position.
Figure 24:
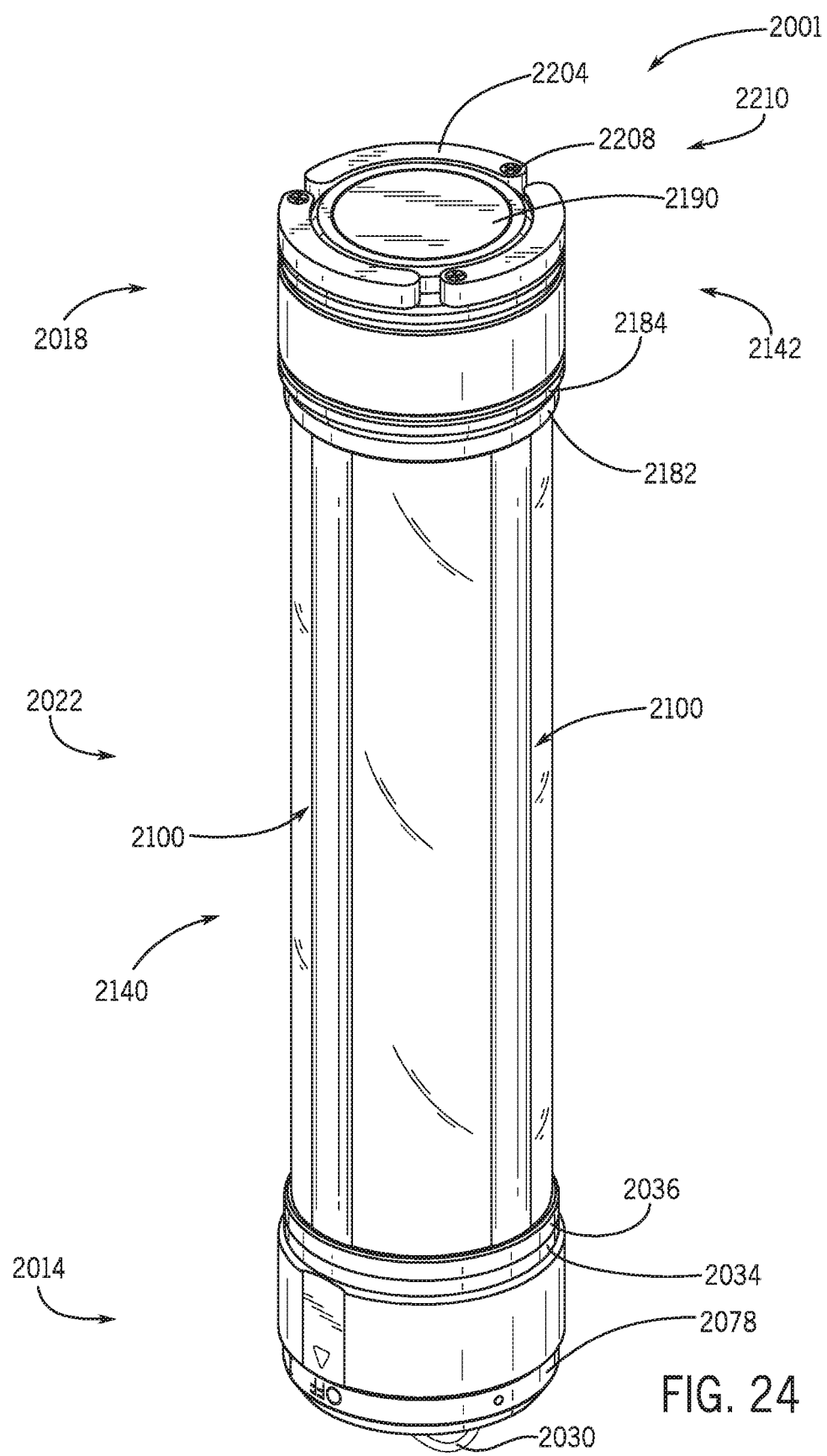
FIG. 24 is a bottom perspective view of the portable light shown in FIG. 23, showing the stabilization assembly in the retracted position and a securement member in a deployed position.
Figure 25:
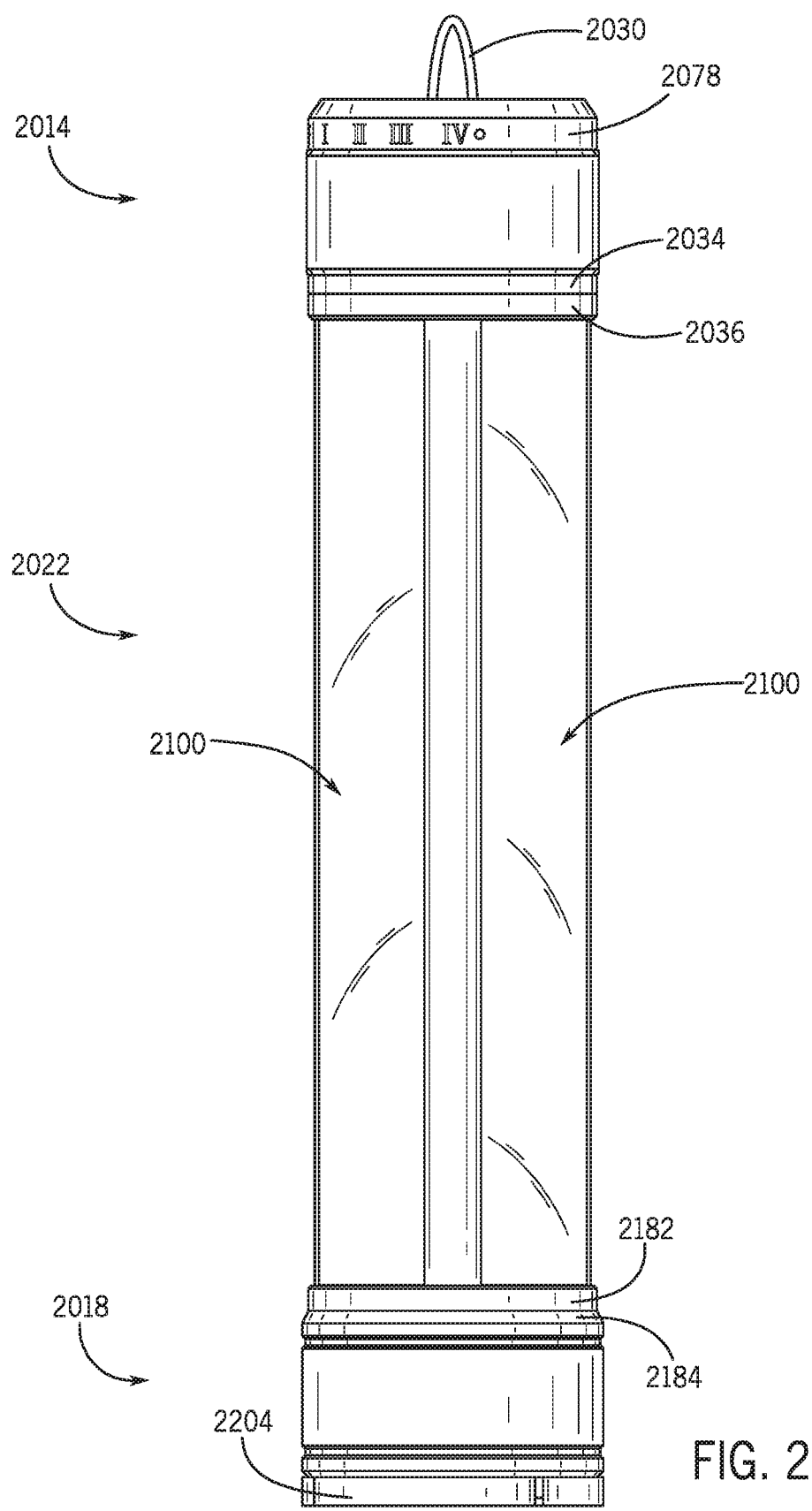
FIG. 25 is a front view of the portable light source shown in FIG. 23, wherein the securement member is in a deployed position.

The mode selector assembly 32 allows the user to select the operating mode of the portable light 10. In particular, the mode selector assembly 32 allows the user to select one of the lighting elements 100 for illumination or a plurality of lighting elements 100 for illumination. This selection is performed by angularly displacing the mode selector 32 about the central axis A-A. Referring to FIGS. 9 and 13, the mode selector assembly 32 includes: (i) the mode selector ring 82, (ii) the mode selector PCB 84, (iii) the mode selector aperture 70, (iv) a mode selector arm 92, (v) screw 94, (vi) a spring 96, and (vii) a ball 98. The mode selector ring 82 is slidingly coupled to the upper housing and circumscribes a portion 102 of the upper housing 26. In particular, mode selector ring 82 is positioned between the upper flange 78 of the upper housing 26 and the first connector ring 34. The mode selector ring 82 is configured to be angularly displaced relative to the upper housing 26. As shown in FIGS. 1-5, the mode selector ring 82 may have a textured or knurled (e.g., strait, angled, or crossed line) engaging surface 106 and a substantially flat, minor outer surface 104. The textured or knurled surface 106 may be included to enhance a user's grip when rotating the mode selector ring 82. It should be understood that that the textured or knurled surface 106 may be omitted (see FIGS. 23-25) or may be reduced in size. The minor outer surface 104 may contain a selection indicator 108 to indicate which illumination mode has been selected.

During operation, the user aligns the selection indicator 108 with an illumination mode indicia 110 that is disposed on the lateral face of the upper flange 78. Specifically, the mode indicia 110 may include "OFF" 110a, "I" 110b, "II" 110c, "III" 110d, and "IV" 110e. The upper flange 78 does not move relative to the mode selector ring 82. Thus, the application of an angularly force on the mode selector ring 82 relative to the upper flange 78 results in a movement of the selection indicator 108 relative to the mode indicia 110. It should be noted that the mode selector ring 82 may only need to be angularly displaced approximately 100 degrees to move the mode selector ring 82 from a first or "OFF" position to a final or all on position. Nevertheless, it should be understood that other degrees of angularly displacement (e.g., 5 degrees to 360 degrees) between the operational modes may be chosen.

The mode selector ring 82 also has a substantially smooth inner surface 111 with a recess 112 formed therein. The mode selector arm 92 is coupled to the center of the mode selector PCB 84 by the screw 94 and is configured to extend through the mode selector aperture 70 and into an extent of the recess 112 that is formed within the inner surface 111 of the mode selector ring 82. A spring 96 and a ball 98 are configured to be positioned between the mode selector arm 92 and the mode selector PCB 84. The ball 98 is configured to be positioned within dimples 114 formed in the mode selector PCB 84. During operation, the user may apply an angular force on the mode selector ring 82 to move the selection indicator 108 from the mode indicia 110a. This clockwise angular force applies pressure on the ball 98, such that the ball 98 applies a downward pressure on the spring 96, which allows the ball 98 to move out of a dimple 114a formed in the mode selector PCB 84. The ball 98 then slides radially along the mode selector PCB 84, while staying in contact therewith. Once the user has moved the mode selector ring 82 to the point that the selection indicator 108 is aligned with the mode indicia 110b, the ball 98 is forced by the spring 96 into a different dimple 114b formed in the mode selector PCB 84. Once the ball 98 makes contact with the different dimple 114, operational mode of the portable light 10 is altered. Additional details about the operation of the mode selector assembly 32 are discussed in greater detail below.

It is to be understood that the mode selector assembly 32 can be replaced with an assembly that is configured to utilize one or more buttons, switches, sliders, local sensors (e.g., motion, light, sound, heat, motion), or other types of electrical selection devices. In one embodiment, the mode selector ring 82 and its associated circuitry may be replaced by a button and the necessary circuitry to allow a user to select the desired operational mode by depressing the button a predetermined number of times. For example, the user: (i) may depress the button one time to turn "On" on lighting element 100, (ii) may depress the button two time to turn "On" on two of the lighting element 100, or (iii) may depress the button five time to turn "Off" on lighting element 100. Additionally, the luminosity selector assembly 28 may be remotely located from the portable light 10. For example, the luminosity selector assembly 28 may be located on a remote wireless device, such as the remote devices described in U.S. patent application Ser. No. 15/812,852, filed on May 17, 2018, and which is fully incorporated herein by reference. Another example of a remote wireless device includes a cellphone, laptop, RF remote control, or other devices that are connected to the portable light 10 via the internet (e.g., wireless camera, motion sensor, light sensor, timer, etc.).

As best shown in FIG. 9, the lighting element holder 118 electrically couples the lighting elements 100 to a first power source PCB 124. The lighting element holder 118 includes substantially straight sections 120 that are connected to one another by angled projections 122. The angled projections 122 extent both above and below the substantially straight sections 120. The top extend of the angled projections 122 define a receiver, which receives an extent of a positioning ring 116. This configuration centers the lighting element holder 118 in the middle of the portable light 10. The bottom extent of the angled projections 122 operably couple the first power source PCB 124 to the lighting elements 100 by applying pressure to an extent of the outer surface of the lighting elements 100. The coupling of the first power source PCB 124 and the lighting elements will be described in greater detail below.

The first power source PCB 124 is configured to electrically couple the lighting elements 100 with: (i) the power source 134, (ii) the first power source PCB 124, (iii) the mode selector PCB 84, (iv) the luminosity PCB 54, and (v) other circuitry components. Referring to FIG. 9, the first power source PCB 124 includes a top surface 126 and a bottom surface 128. The top surface 126 includes surface mounted circuitry, such as resisters, capacitors, or etc. The bottom surface 128 of the first power source PCB 124 includes a power source contact that is made from a conducting material and is configured to make contact with a power source 134. In particular, the power source contact includes two separate contacts that are coplanar within one another, wherein the first contact 123 is a small circular disk located in the center of the portable light 10 and the second contact 125 is a ring that encircles the first contact 123. As will be discussed in greater detail below, the first contact 123 is configured to receive a positive charge from the power source 134, while the second contact 125 is configured to receive a negative charge from the power source 134. It should be understood that in an alternative embodiment the first contact 123 may receive a negative charge from the power source 134, while the second contact 125 may receive a positive charge from the power source 134. In addition, the configuration of the contacts that form the power source contact may include other configurations, such as contacts that are positioned side by side or that are positioned on different heights when compared to one another.

The first power source PCB 124 also includes projections 132 and PCB lighting contacts 130 that are disposed on the sides of the first power source PCB 124. The projections 132 extend radially outward from the first power source PCB 124 and include apertures 138 formed therethrough. The apertures 138 are configured to receive an extent of the intermediate section 22 of the portable light 10. The PCB lighting contacts 130 are formed between the projections 132. This configuration of projections 132 and apertures 138 helps ensure that the PCB lighting contacts 130 are properly aligned with intermediate section 22. Specifically, the lighting elements 100 have lighting element contacts 129 that are disposed on the rear surface 136 of lighting elements 100. When the portable light 10 is assembled, the lighting element contacts 129 are positioned adjacent to the PCB lighting contacts 130. The positional relationship between the lighting element contacts 129 and the PCB lighting contacts 130 is maintained by an inward directed force that is applied to the outer surface of the lighting elements 100 by the lighting element holder 118. It should be understood that other methods, such as the soldering of wires to each of the contacts, may be used to operably couple the lighting elements 100 to the first power source PCB 124.

Referring to FIGS. 1, 9-11, and 13, the intermediate section 22 of the portable light 10 includes a middle or intermediate housing 140 and one or more lighting elements 100. The intermediate housing 140 extends between the first end assembly 24 and a second end assembly 142. The intermediate housing 140 includes: (i) a central body 144 that has a first end 146 and a second end 148, (ii) a plurality of external ribs 150 that extend both radially from the central body 144 and longitudinally along a length $L_{CB}$ of the central body 144, (iii) a plurality of channels 158 that extend laterally between a pair of the ribs 150 and longitudinally along a length $L_{CB}$ of the central body 144, (iv) a set of projections 151 that extend from a first end 146 of the central body 144, and (v) a set of recessed sections 152 that are positioned proximate to the second end 148 of the central body 144. Preferably, the projections 151 are angularly aligned with the ribs 150 (see FIG. 13), such that a projection 151 extends longitudinally from a rib 150. The central body 144 has an elongated substantially cylindrical configuration, where the length $L_{CB}$ of the central body 144 (see FIG. 9) substantially exceeds the width of the central body 144. It should be understood that in other embodiments, the central body 144 may have an alternative configuration, such as a triangular prism, a rectangular prism, a cube, a pentagonal prism, a hexagonal prism, octagonal prism, sphere, a cone, a tetrahedron, a cuboid, a dodecahedron, a icosahedron, a torus, a octahedron, a ellipsoid, or any other similar shape The central body 144 is configured to be operably coupled to the first end assembly 24 and the second end assembly 142. Specifically, exterior threads 154 that are formed in the projections 151 of the central body 144 are configured to be received by the second set of internal threads 74 formed in the upper housing 26; thereby, operably coupling the first end assembly 24 to the intermediate housing 140. The exterior threads 196 that are formed in the recessed sections 152 of the central body 144 are configured to be received by a set of internal threads 194 formed in a base connector 184; thereby, operably coupling the second end assembly 142 to the intermediate housing 140.

A receiver 153 is formed within the central body 144 and is configured to receive at least a substantial extent of the power source 134, and preferably the entirety of the power source 134. In the embodiment of the Figures, including FIGS. 9 and 10, the power source 134 is completely contained within the receiver 153, wherein the power source 134 is radially inward from: (i) the central body 144, (ii) the plurality of external ribs 150, (iii) a plurality of channels that are formed between the ribs 150, and (iv) the lighting elements 100. In other words, the receiver 153 is configured to surround the power source 134, which in turn positions the power source 134 substantially in the center of the portable light 10.

Figure 10:
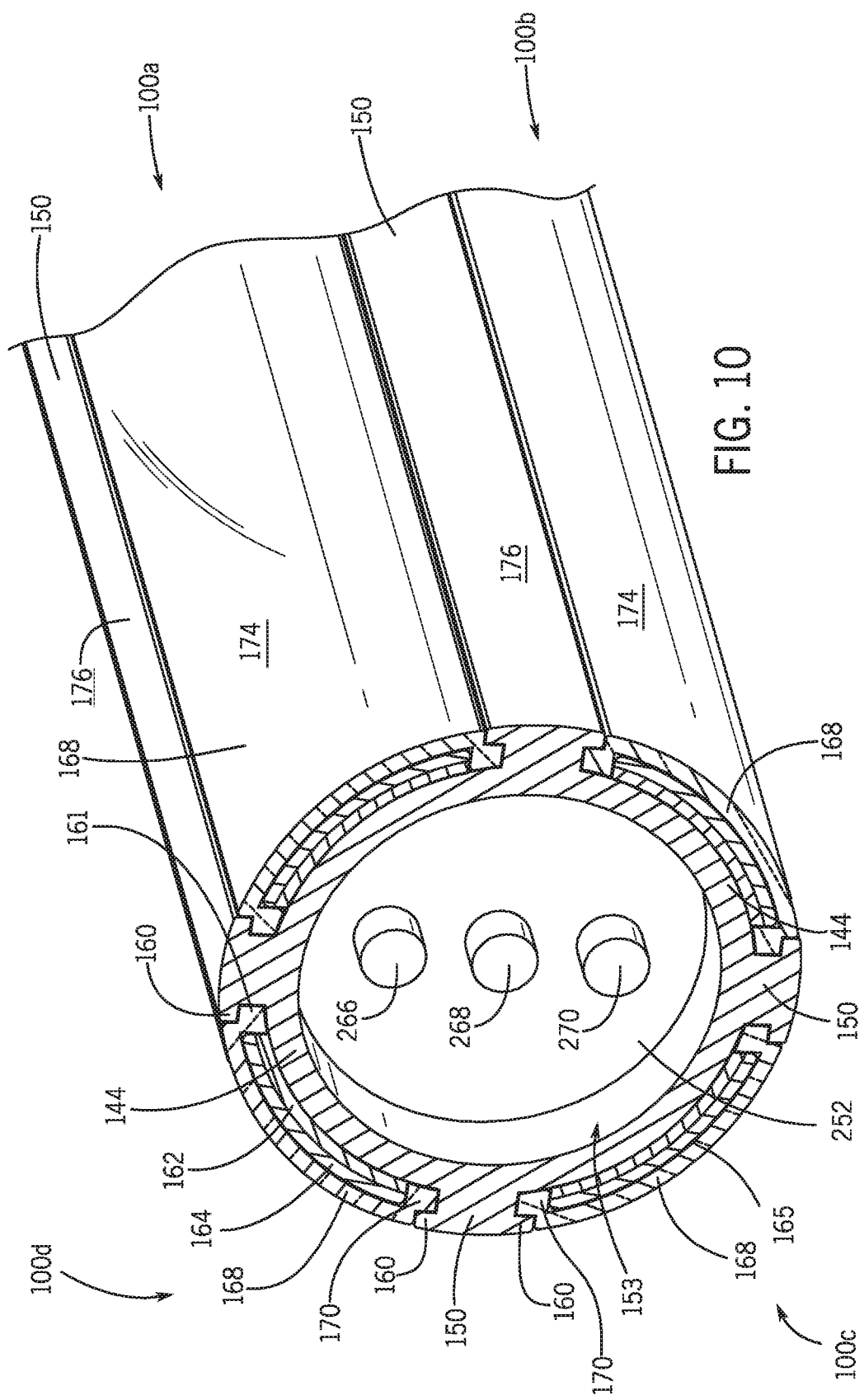
FIG. 10 is a cross-sectional view with perspective treatment of the portable light shown in FIG. 1 taken along line 10-10 of FIG. 4.

The plurality of external ribs 150 extend radially outward from the central body 144 and longitudinally along a length $L_{CB}$ of the central body 144. As shown in FIG. 10, the central body 144 has both an inner diameter and an outer diameter that are less than an outer diameter defined by an outer surface 176 of the plurality of ribs 150. Each rib 150 includes two lateral projections 160 that extend in opposite lateral directions from one another, which provides the rib 150 with a "T-shape" in cross section. Like the ribs 150, the lateral projections 160 also extend longitudinally along a length $L_{CB}$ of the central body 144. The lateral projections 160 form a recess 161 on each side of the rib 150, that as discussed below is configured to receive an extent of the lens 168. In one embodiment (see FIGS. 10-11), the ribs 150 may be evenly spaced a distance apart circumferentially around the central body 144. Accordingly, this configuration alternates between ribs 150 and lenses 168 to provide a portable light 10 that can radiate light omni-directionally or 360 degrees. In alternative embodiments, the ribs 150 may not be evenly spaced around the central body 144.

Figure 11:
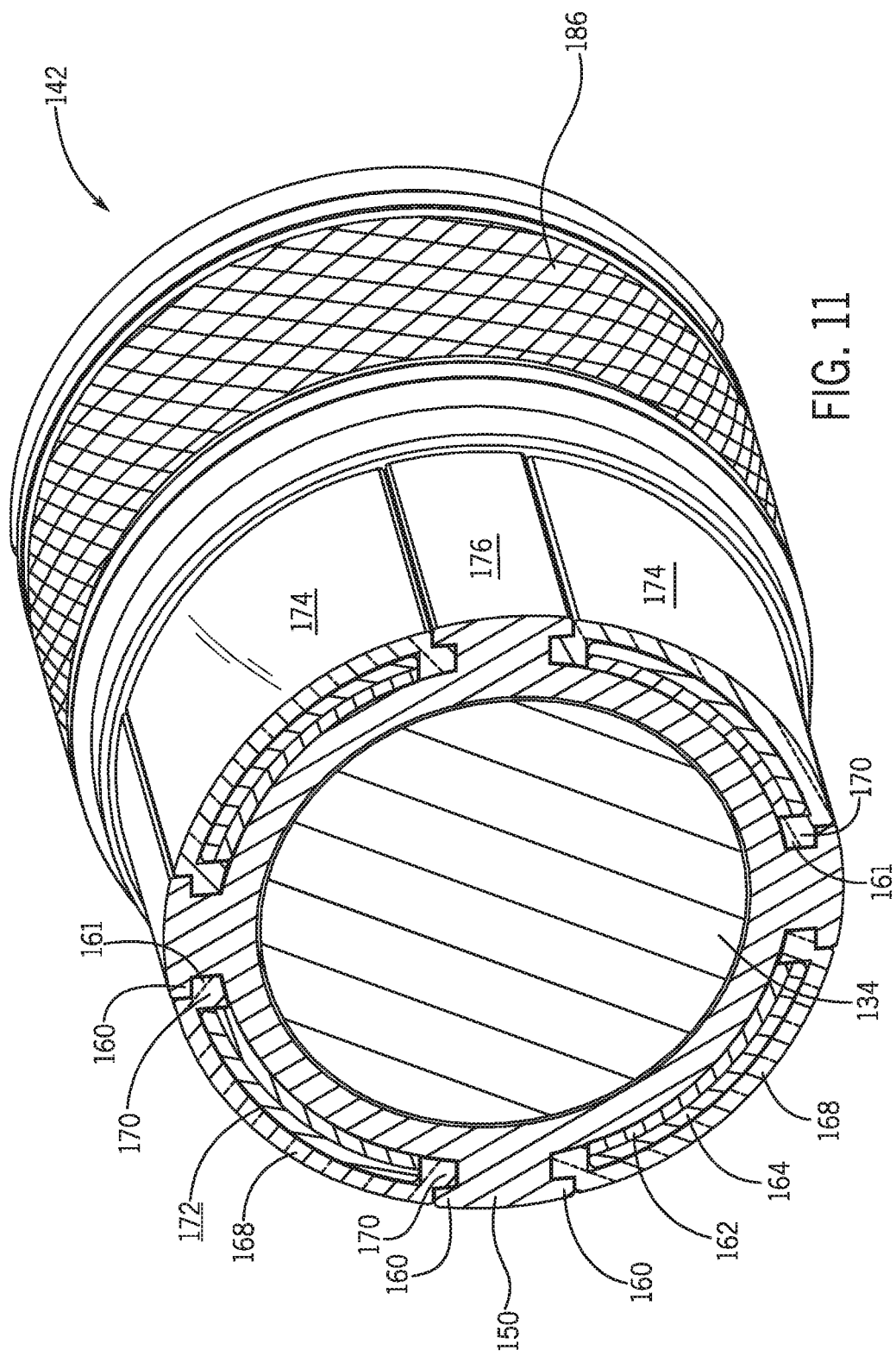
FIG. 11 is a cross-sectional view with perspective treatment of the portable light shown in FIG. 1 taken along line 11-11 of FIG. 4.

The area between each pair of ribs 150 forms a channel 158. Accordingly, each channel 158 extends longitudinally along the central body 144. These channels 158 can have an arced or curvilinear configuration, as shown in FIGS. 10 and 11. Alternatively, the channels 158 may be substantially flat, as shown in FIG. 13. Each channel 158 is configured to receive one of the lighting elements 100. This configuration allows for the lighting elements 100 to be positioned radially outward of the central axis A-A, while extending longitudinally along the housing 140 in a direction that is parallel to, or substantially parallel, to the central axis A-A. This in turn allows light that is emitted from the one or more lighting elements 100 to primarily radiate in a direction that is perpendicular to a longitudinal axis of the housing 140 and a longitudinal axis of the power source 134. In other words, the light that is emitted from the one or more lighting elements 100 is not configured to emit light that is primarily parallel with the longitudinal axis of housing 140 or the longitudinal axis of power source 134.

As mentioned above, each channel 158 is configured to receive one of the lighting elements 100. Accordingly, the lighting elements 100 are configured to extend longitudinally along the central body 144. As shown in FIGS. 9 and 13, the lighting elements 100 extend across almost the entire length of the power source 134. In other words, the lighting elements 100 have a length that is nearly (e.g., 90% of the length) as long as the length of the power supply 134. Also, as shown in FIGS. 9 and 13, the lighting elements 100 have a length that is greater than the central body 144. This configuration facilitates the retention of the lighting elements 100 within the portable light 10.

Each lighting elements 100 has a lighting element PCB 162 and an emitter assembly 164. The lighting element PCB 162 is disposed radially inward from the emitter assembly 164 and the lens 168 and is configured to reside within the channels 158. As shown in FIGS. 9 and 13, the lighting element PCB 162 has a longer configuration then the emitter assembly 164 and the lens 168, which allows the lighting element PCB 162 to extend into an extent of the first and second assemblies 24, 142 and allows the emitter assembly 164 to reside outside of the first and second assemblies 24, 142. This configuration facilitates the operable coupling of the power source 134 and the emitter assembly 164. Accordingly, the lighting element PCB 162 extends longitudinally along the central body 144.

As mentioned above, the lighting elements 100 have lighting element contacts 129 and a rear surface 136. The specific structure of the lighting elements 100 that contain these structures is the lighting element PCB 162. Thus, the lighting element PCB 162 is configured to be operably couple to the first power source PCB 124. The emitter assembly 164 is also configured to be operably coupled to the emitter assembly 164. Accordingly, the lighting element PCB 162 allows current to flow from the power source 134 to the emitter assembly 164 when the portable light 10 is in the "On" position.

The emitter assembly 164 is disposed on the outer surface of the lighting element PCB 162, while being positioned radially inward from the lens 168. Each emitter assembly 164 may be composed of between 10 and 200 individual emitters 165, preferably between 15 and 150 individual emitters 165, and most preferably between 50 and 100 individual emitters 165. Every individual emitter 165, which is a part of the emitter assembly 164, are configured to illuminate when power is applied to the emitter assembly 164 by the lighting element PCB 162. Each emitter assembly 164 may produce between 0 and 1000 lumen, preferably between 0 and 750, and most preferably between 0 and 500. Accordingly, a portable light 10 that has four light emitter assembles 164 may produce between 0 and 4000 lumen, preferably between 0 and 3000, and most preferably between 0 and 2000. It should be understood that is other embodiments every individual emitter 165 contained within the emitter assembly 164 may not be configured to illuminate when power is applied to the emitter assembly 164. For example, a user may be able to select the desired individual emitters 165 that the user wants illuminated, while keeping other individual emitters 165 in the unilluminated.

As shown in FIGS. 9-11, the portable light 10 does not include a secondary optic nor does it include a reflector. Accordingly, substantially all of the light that is emitted from the emitter assembly 164 passes directly from the emitter assembly 164, through the lens 168, and to the surrounding environment. This configuration may be desired, as substantially no light is lost due to material absorptions outside of the lens 168. Further, this configuration allows for a uniform and wide distribution of light. This configuration may be accomplished by using a Chip on Board ("COB") LED or surface-mount device LED. In this configuration there is no secondary optic and the lens 168, which acts as the primary optic, can be configured to overlay multiple individual light emitters 165 that are a part of the emitter assembly 164. Specifically, if a COB LED is used as the emitter assembly 164, then the lens 168 may overlay at least 20 individual light emitters 165 and preferably all of the individual light emitters 165 (e.g., 60 individual light emitters).

In other embodiments, a secondary optic or a reflector may be used. For example, if a standard LED is selected as the emitter, the portable light 10 may have a secondary optic. In this configuration, the primary optic for the standard LED is the optic that surrounds the LED, while the secondary optic is the lens 168. This secondary optic may be configured to protect the standard LEDs from the surrounding environment and protects the user from contacting the hot outer surface of the primary optics after the LEDs. Alternatively, the portable light 10 may include a reflector that is positioned between the edges of the emitter assembly 164 and the ribs 150. This reflector may help focus the light that is emitted from the emitter assembly 164 in a specific direction to achieve a desired light distribution. In a further alternative, the emitter assembly 164 may be positioned such that it is facing inward, towards the center of the portable light 10, and the reflector may direct light from the emitter assembly 164 out through the lens 168. This configuration may provide a softer lighting effect, as no direct light that is emitted from the emitter assembly 164 can exit the portable light 10 without being reflected. It should be understood that any combination of these alternative embodiments may be combined in the portable light 10. For example, the elongated light source may have: i) lighting element 100 that has a recessed emitter assembly 164, which includes reflectors that extends from the outer edges of the recessed emitter assembly 164 to the outer edges of the ribs 150, and ii) lighting elements 100 that are positioned on either side of the first lighting element 100 that do not have a reflector or a secondary optic.

The lens 168 is positioned radially outward from the lighting element PCB 162 and the emitter assembly 164 and functions as a primary optic for the lighting element 100. The lens 168 has an inner surface 172 and an outer surface 174, where the outer surface 174 is configured to be radially aligned with an outer surface 176 of the ribs 150. This configuration provides a substantially smooth outer surface of the portable light 10. The lens 168 includes one or more lens tabs or projections 170, which are dimensioned to be received by the recess 161 to secure the peripheral edges of the lens 168 under the lateral projections 160 of the ribs 150. The lens 168 serves to physically protect the lighting element PCB 162 and the emitter assembly 164, while allowing at least a substantial extent or entirety of the light generated by the emitter assembly 164 to pass through the lens 168. As shown in FIG. 10, the central body 144 has both an inner diameter and an outer diameter that are less than an outer diameter defined by an outer surface 174 of the plurality of lenses 168. The outer surface 174 of each lens 168 has a curvilinear configuration and the outer surface 176 of each rib 150 has a curvilinear configuration, wherein these outer surfaces 174, 176 are substantially flush with each other. Also, the outer surfaces 174, 176 combine to provide a substantially smooth outer curvilinear surface for the central body 144 that is devoid of appreciable gaps or ridges, which helps the user to easily grasp the central body 144 for securement of the light 10 and improves the aesthetic appearance of the light 10.

Depending on the type of selected emitter assembly 164 and the configuration of the channels 158, the inner surface 172 of the lens 168 may be in contact with an outer surface of the emitter assembly 164 (see FIGS. 10-11) or there may be an air gap 166 that is positioned between the outer surface of the emitter assembly 164 and the inner surface 172 of the lens 168. This air gap 166 may be filled with standard air, an inert gas, or a material that changes the reflective properties of the emitter assembly 164 (e.g., fused quartz or fluorite). In an alternative embodiment, the lens 168 may be omitted, its configuration may be changed, or there may be multiple lenses. For example, lens 168 may be omitted if the emitter assembly 164 that is chosen already has a protective cover.

In some implementations, the intermediate section 22 includes four lighting elements 100a, 100b, 100c, and 100d that are positioned radially around the housing 140 and the power source 134. The four lighting elements 100a, 100b, 100c, and 100d may be evenly spaced radially around the exterior of the intermediate section 22. This configuration allows for each lighting element 100 to project light in a 90 degree radial pattern around the portable light 10. Accordingly, when two lighting elements 100 are illuminated, the portable light projects light in a 180 degree pattern around the portable light 10. Similarly, when all four lighting elements 100 are illuminated, light is projected in a 360 degree pattern around the portable light 10. This configuration positioned the power source 134 between lighting elements 100a and 100c. Likewise, the power source 134 is also positioned between lighting elements 100b and 100d. Specifically, the power source 134 is centered between lighting elements 100a and 100c. Likewise, the power source 134 is centered between lighting elements 100b and 100d. Accordingly, the lighting elements 100 are configured to project light in a 360 degree pattern around the power source 134.

It should be understood that the lighting elements may 100a, 100b, 100c, and 100d not be evenly spaced around the exterior of the intermediate section 22. For example, it may be beneficial to place two lighting elements abutting one another to provide a larger quantity of focused light in one area. Additionally, it should be understood that more or less than four lighting elements 100 may be included in the intermediate section 22. For example, the intermediate section 22 may include one lighting element 100 or ten lighting elements 100 that extend the entire length of the intermediate section 22. Specifically, one lighting element 100 may be utilized that encircles the entire central body 144. Further, the other configurations of lighting elements 100 are contemplated herein. For example, the intermediate section 22 may include eight lighting elements 100, where each lighting element 100 does not extend the entire length of the intermediate section 22. Instead, each lighting elements 100 only extends from the edge of the intermediate section 22 to the middle of the intermediate section 22. It should be understood that any combination of the above embodiments is contemplated by this disclosure.

The power source 134 is configured to be positioned within the receiver 153 formed within the central body 144. The power source 134 provides electrical power to the portable light 10. Referring to FIGS. 8-10 and 26-28, the power source 134 may be a combination of removable non-rechargeable batteries 278 disposed within a battery cartridge 250. The battery cartridge 250 includes: (i) a first end cap 252, (ii) a second end cap 254, (iii) a first plurality of end cap contacts 256, (iv) a second plurality of end cap contacts 258, (v) a first battery cartridge PCB 260, (vi) a second battery cartridge PCB 262, a connecting wire 264, (vii) a plurality of ribs 265. The first plurality of end cap contacts 256 has three individual end cap contacts 266, 268, and 270, while second plurality of end cap contacts 258 also has three individual end cap contacts 272, 274, and 276. The first plurality of end cap contacts 256 extends through the first end cap 252 and are configured to operably couple the non-rechargeable batteries 278 disposed within a battery cartridge 250 to the first power source PCB 124, when the power source 134 is disposed within the portable light 10. The second plurality of end cap contacts 258 extends through the second end cap 254 and are configured to operably couple the non-rechargeable batteries 278 disposed within a battery cartridge 250 to a second power source PCB 178, when the power source 134 is disposed within the portable light 10.

The plurality of ribs 265 that are formed in the battery cartridge 250 may include three elongated ribs that connect the first end cap 252 to the second end cap 254. These elongated ribs 265 hold the removable non-rechargeable batteries 278 (e.g., 9 AA batteries) within the battery cartridge 250. To facilitate the holding of the batteries 278 within the battery cartridge 250, the ribs 265 may have projections that are configured to extend around a portion of the batteries 278, when the batteries 278 are placed within the battery cartridge 250. It should be understood that different configurations of a battery cartridge 250 may be implemented, such that additional (e.g., 12 or 15 total batteries) or fewer (e.g., 1-9 total batteries) batteries 278 are used or larger (e.g., C or D) or smaller (e.g., AAAA or AAA) battery sizes.

Positioned between the elongated ribs 265 and the end caps 252, 254 are the first and second battery cartridge PCBs 260, 262, respectively. The first battery cartridge PCB 260 includes a plurality of contacts 280 disposed on an inner surface and a plurality of contacts 282 disposed on an outer surface. The inner surface contacts 280 are configured to make contact with the positive charged end of the batteries 278, while the outer surface contacts 282 are configured to make contact with the first plurality of end cap contacts 256. The first battery cartridge PCB 260 electrically couples together all of the inner surface contacts 280 with end cap contact 262. This enables the positive charge from all of the removable non-rechargeable batteries 278 to be connected to the first contact 123 on the first power source PCB 124, when the power source 134 is positioned within the portable light 10. The first battery cartridge PCB 260 electrically couples together the outer surface contacts 282 that are electrically connected to end cap contacts 260 and 264.

The second battery cartridge PCB 262 includes a plurality of contacts 284 disposed on an inner surface and a plurality of contacts 286 disposed on an outer surface. The inner surface contacts 284 are configured to make contact with the negative charged end of the batteries 278, while the outer surface contacts 286 are configured to make contact with the second plurality of end cap contacts 258. The second battery cartridge PCB 262 electrically couples together all of the inner surface contacts 284 with end cap contacts 266 and 270. This enables the negative charge from all of the removable non-rechargeable batteries 278 to be connected to the second power source PCB 178, when the power source 134 is disposed within the portable light 10. The connecting wire 264 extends from the first battery cartridge PCB 260 to the second battery cartridge PCB 262 and electrically couples end cap contacts 260 and 264 with contact 268.

Figure 26:
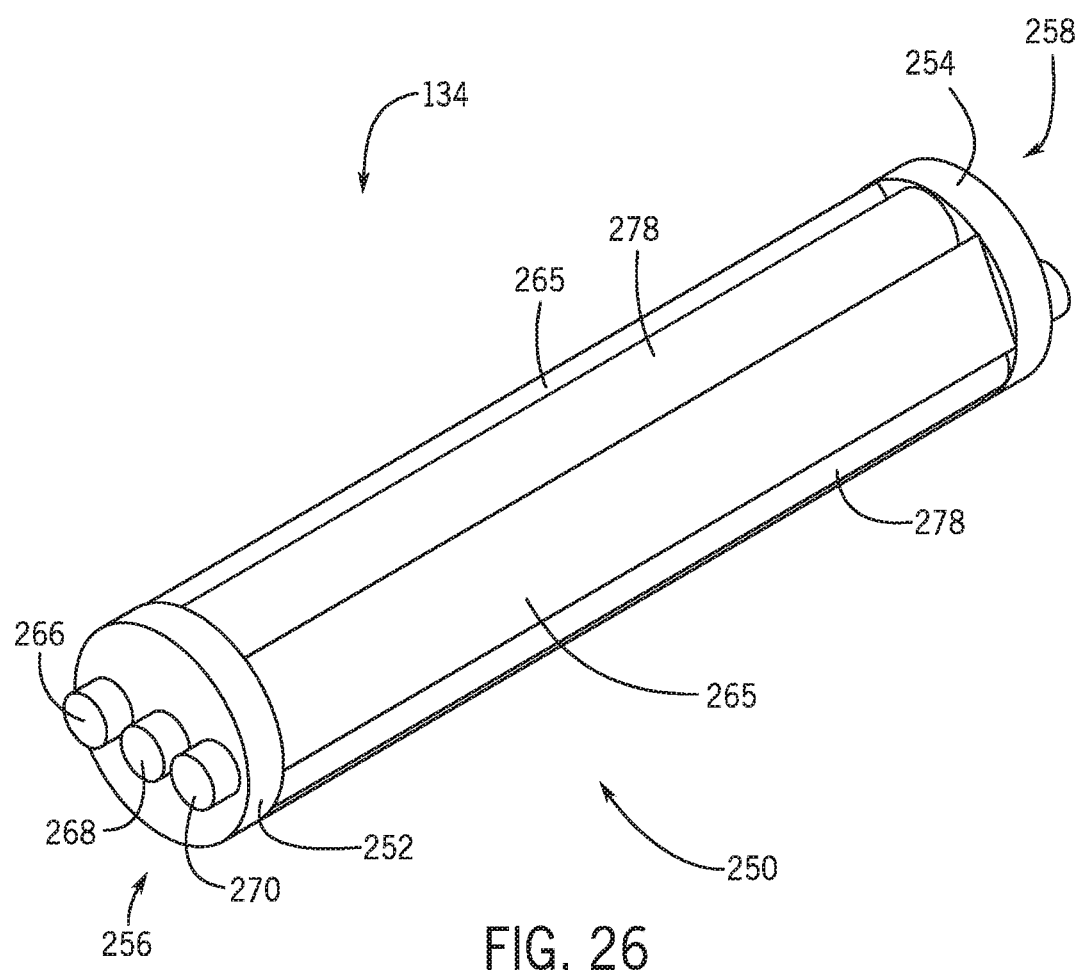
FIG. 26 is a perspective view of the power source for use with the portable light shown in embodiments 1-3.
Figure 27:
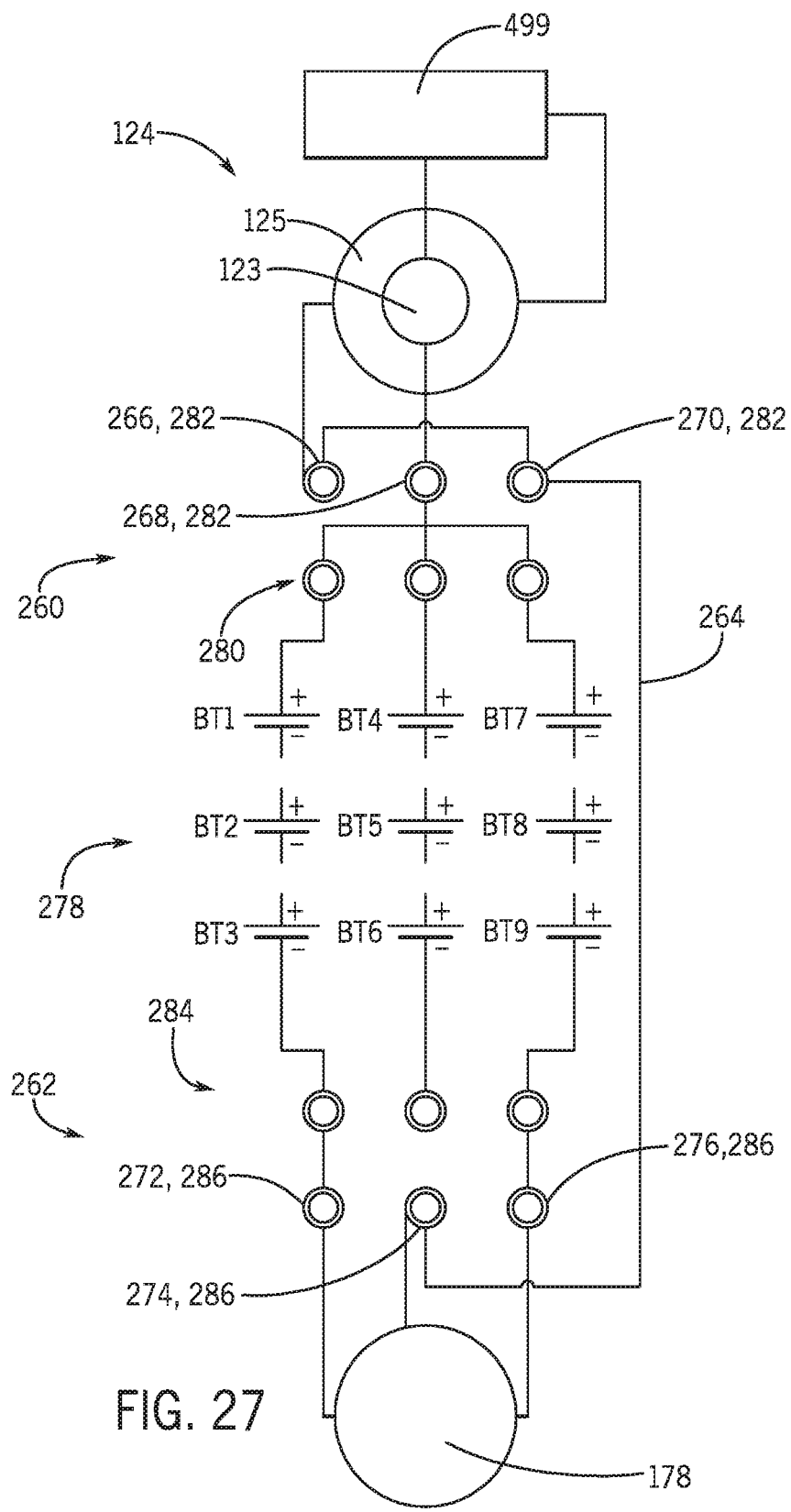
FIG. 27 is a block diagram of the circuitry in the power source and the portable light of embodiments 1-3 in a first direction.

Referring to FIGS. 26 and 27, the configuration of the power source 134 allows it to supply power to the portable light 10 regardless of which direction the power source 134 is inserted within the portable light 10. In other words, the portable light 10 will work when first end cap 252 is placed adjacent to the first power source PCB 124 or when the first end cap 252 is placed adjacent to the second power source PCB 178. The following describes how current flows through the portable light 10, when the first end cap 252 is placed adjacent to the first power source PCB 124 (see FIG. 27). The positive current flows from the removable non-rechargeable batteries 278 to all of the inner surface contacts 280 on the first battery cartridge PCB 260. Next, the current flows from the inner surface contacts 280 to the outer surface contact 282 that correspond to end cap contact 268. Next, current flows from the outer surface contact 282 that correspond to end cap contact 268 to end cap contact 268. Next, current flows from end cap contact 268 to the first contact 123 associated with the first power source PCB 124. Next, the current flows from the first contact 123 associated with the first power source PCB 124 to the circuitry 499 contained within the portable light 10, including the lighting elements 100. Next, the current flows from the circuitry 499 contained within the portable light 10 to the second contact 125 associated with the first power source PCB 124. Next, the current flows from second contact 125 associated with the first power source PCB 124 to end cap contacts 266 and 270. Next, the current flows from the end cap contacts 266 and 270 to outer surface contacts 282 that are associated with end cap contacts 266 and 270. Next, the current flows from the outer surface contacts that are associated with end cap contacts 266 and 270 to the connecting wire 264. Next, the current flows from the first end of the connecting wire 264 to the second end of the connecting wire 264. Next, the current flows from the second end of the connecting wire 264 to the outer surface contact 286 that is associated with end cap contact 274. Next, the current flows from outer surface 286 contact that is associated with end cap contact 274 to end cap contact 274. Next, the current flows from the end cap contact 274 to the second power source PCB 178. Next, the current flows from the second power source PCB 178 to the end cap contacts 272 and 276. Next, the current flows from the end cap contacts 272 and 276 to the outer surface contacts 286 of the second battery cartridge PCB 262 to all of the inner surface contact 284. Finally, the current flows from the inner surface contacts 284 to the negative charged ends of the batteries 278.

Figure 28:
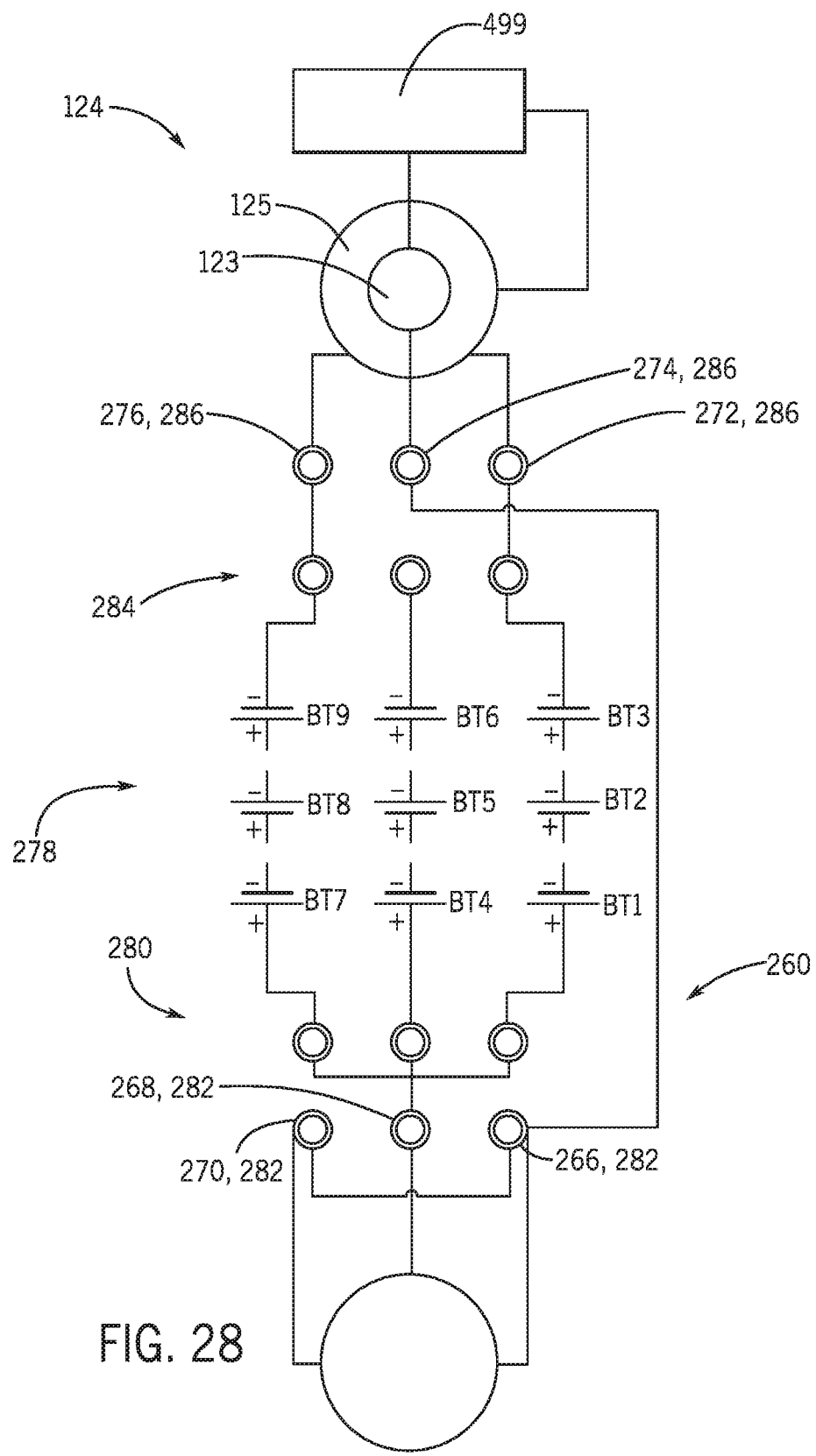
FIG. 28 is a block diagram of the circuitry in the power source and the portable light of embodiments 1-3 in a second direction.

Alternatively, the following describes how current flows through the portable light 10, when the second end cap 254 is placed adjacent to the first power source PCB 124 (see FIG. 28). The negative current flows from the removable non-rechargeable batteries 278 to all of the inner surface contacts 284 on the second battery cartridge PCB 262. Next, the current flows from the inner surface contacts 284 to the outer surface contact 286 that correspond to end cap contacts 272 and 276. Next, current flows from the outer surface contacts 286 that correspond to end cap contacts 272 and 276 to end cap contacts 272 and 276. Next, current flows from end cap contacts 272 and 276 to the second contact 125 associated with the first power source PCB 124. Next, the current flows from the second contact 125 associated with the first power source PCB 124 through the circuitry 499 contained within the portable light 10, including the lighting elements 100. Next, the current flows from the circuitry 499 contained within the portable light 10 to the first contact 123 associated with the first power source PCB 124. Next, the current flows from first contact 123 associated with the first power source PCB 124 to end cap contact 274. Next, the current flows from the end cap contact 274 to outer surface contacts 286 that is associated with end cap contact 274. Next, the current flows from the outer surface contacts 286 that is associated with end cap contact 274 to the connecting wire 264. Next, the current flows from the first end of the connecting wire 264 to the second end of the connecting wire 264. Next, the current flows from the second end of the connecting wire 264 to the outer surface contact 282 that is associated with end cap contacts 266 and 270. Next, the current flows from the end cap contacts 266 and 270 to the second power source PCB 178. Next, the current flows from the second power source PCB 178 to the end cap contact 268. Next, the current flows from the end cap contact 268 to outer surface contact 282 that is associated with end cap contact 268. Next, the current flows from the outer surface contact 282 that is associated with end cap contact 268 to all of the inner surface contacts 280. Finally, the positive current flows from the inner surface contacts 280 to the positive charged ends of the batteries 278. Accordingly, the power source 134 can be operably connected to the portable light 10 in either direction.

It should be understood that instead of being a combination of removable non-rechargeable batteries 278 disposed within a battery cartridge 250, the power source 134 may be a removable non-rechargeable battery, a removable rechargeable battery, a combination of removable rechargeable batteries, a combination of removable rechargeable batteries disposed within a battery cartridge 250, a non-removable rechargeable battery, a combination of non-removable rechargeable batteries disposed within a battery cartridge 250, a DC power supply that is configured to connect to a 12 volt car battery, a DC power supply that is configured to connect to a 110 volt alternative current outlet, or any other type of power supply that is known to a person of skill in the art.

The second end assembly 142 is operably connected to the second end 18 of the portable light 10. The second end assembly 142 allows the portable light to be mounted in a multitude of different positions (e.g., one a magnetic support surface 44, with the retractable stabilization assembly 192 in a retracted state 210, or with the retractable stabilization assembly 192 in a deployed state 212). The second end assembly 142 includes: (i) a connector ring 182, (ii) base connector 184, (iii) a bottom housing 186, and (vi) retractable stabilization assembly 192. The base connector 184 has a first set of internal threads 194 and two sets of external threads 196, 198. The first set of internal threads 194 are configured to engage the set of threads 196 that are positioned within the set of recessed sections 152 that are positioned proximate to the second end 148 of the central body 144. This configuration secures the lighting elements 100 within the channels 158 that are formed within the intermediate housing 140. While the first set of external threads 196 are configured to engage with the threads on the connector ring 182, the second set of external threads 198 are configured to operably engage with a set of internal threads 202 positioned within the bottom housing 186. The threads 198, 202 enable a user to remove the bottom housing 186 from the intermediate housing 140. This in turn permits a user to replace the power source 134 or couple additional accessories to the portable light 10. It should be understood that the bottom housing 186 may be coupled to the intermediate housing 140 using other methods, such as quarter turn connector, a bayonet connector, a pressure fit connector, or other connectors known to one of skill in the art.

The bottom housing 186 includes: (i) the second power source PCB 178, (ii) a magnet receiver 188, and (iii) a magnet 190. The bottom housing 186 may have a textured or knurled (e.g., strait, angled, or crossed line) outer surface 187. The textured or knurled surface 187 may be included to enhance a user's grip when rotating the bottom housing 186. It should be understood that the textured or knurled surface 187 may be omitted (see FIGS. 23-25) or may be reduced in size. As discussed above the second power source PCB 178 is configured to make contact with the power source 134 to complete the electrical circuit. The magnet receiver 188 extends from the bottom surface 199 of the bottom housing 186. This configuration places the magnet 190 a safe distance away from the second power source PCB 178 to ensure that the magnet does not interfere with the electrical circuitry of the portable light 10. The magnet 190 is disposed within the magnet receive 188 and is substantially flush, or in a common plane, with the bottom surface 199 of the bottom housing 186. This configuration ensure places the largest surface area of the magnet 190 in contact with the support surface 44. The strength of the magnet is sufficient to hold the portable light 10 in a horizontal position from a vertical support surface 44. Specifically, the strength of the magnet is between 300 and 30 millitesla, preferably between 200 and 75 millitesla, and most preferably between 150 and 100 millitesla. Alternatively, the magnet 190 may be weaker, substantially stronger, or may be electromagnetically controlled by a battery.

The retractable stabilization assembly 192 is shown FIGS. 1-5, 7-9, 11, 13, and 23-25. In some implementations, as best shown in FIGS. 2, 3, 7-9, the retractable stabilization assembly 192 includes one or more feet 204. The feet 204 are individually retractable and can be selectively positioned into an extended position 212, as exemplarily shown in FIGS. 2 and 8, and can also be selectively positioned into a retracted position 210 as exemplarily shown in FIGS. 1, 3-5, and 7. When the feet 204 are in the retracted position 210, the outer surface of the feet 204 do not extend outside the radius of the outer surface of the ribs 150. When the feet are in the extend position 212, the outer surface of the feet 204 extend outside the radius of the ribs 150. This configuration enables the portable light 10 to more stably stand on the support surface 44, as shown in FIG. 2.

The bottom housing 186 includes a recess 206 that is formed, at least partially by, the magnet receiver 188. The feet 204, or at least a portion of the feet 204, form a substantially flat and flush surface, or a common plane, with the bottom surface 199 of the bottom housing 186. The feet 204 can also form a common plane with a magnet 190. Additionally, the feet 204, or at least a portion of the feet, can be disposed within the recess 206, when the feet 204 are disposed in the retracted position 210. This configuration is facilitated by the substantially arcuate shape of the feet 204. Specifically, when the feet 204 are disposed in the retracted position 210, the feet 204 can form substantially a circle, and thus conform to the generally cylindrical shape of the portable light 10.

Each of the one or more feet 204 can be hingedly attached to the bottom housing 186 of the portable light 10 at a pivot point 208, which can be formed a fastener 209. The feet 204 can be biased towards one or more of the extended position 212 and the retracted position 210. The feet 204 can also lock, through a releasable locking system (not shown) in one or more of the extended position 212 and the retracted position 210 by any mechanical fastening system commonly known to those skilled in the art.

Referring to FIGS. 1-12, the securement member 30 can support, suspend and/or brace the portable light 10 during operation, storage and/or transportation. The first end 14 includes a securement member 30, which is pivotally attached to the first end 14. Specifically, the securement member 30 is coupled to the upper housing 26 at a pivot point 31, which is disposed on the outer surface of the upper flange 78. This configuration allows the securement member 30 to be pivotal attached to the first end 14 and can selectively rotate among a plurality of orientations with respect to the first end 14.

The securement member 30 may have a substantially arcuate shape, but it is to be understood that other shapes are within the scope of this disclosure. The securement member 30 may be selectively disposed in a first, or stowed, position 214, as exemplarily shown in FIGS. 3-6, 8-9, and 11. In the first position 214, the securement member 30 is positioned between the upper edge of the mode selector ring 82 and the outer rim 40. Thus, the securement member 30 is positioned adjacent to the outer surface of the upper flange 78. In this first position 214, the securement member 30 lies in a plane substantially parallel with the first end wall 38 and the outer rim 40.

The securement member 30 may also be selectively disposed in a second, or deployed, position 216, as exemplarily shown in FIGS. 1-2. In the second position 216, the securement member 30 is positioned above the outer rim 40. In this second position 216, the securement member 30 may be positioned at any angle that places it above the outer rim 40 and is fully deployed when securement member 30 is positioned substantially perpendicular to the outer rim 40. It should be understood that the securement member 30 may also have a releasable locking system (not shown), which may secure the securement member 30 in one or more positions (e.g., first position 214 or the second position 216).

Figure 12:
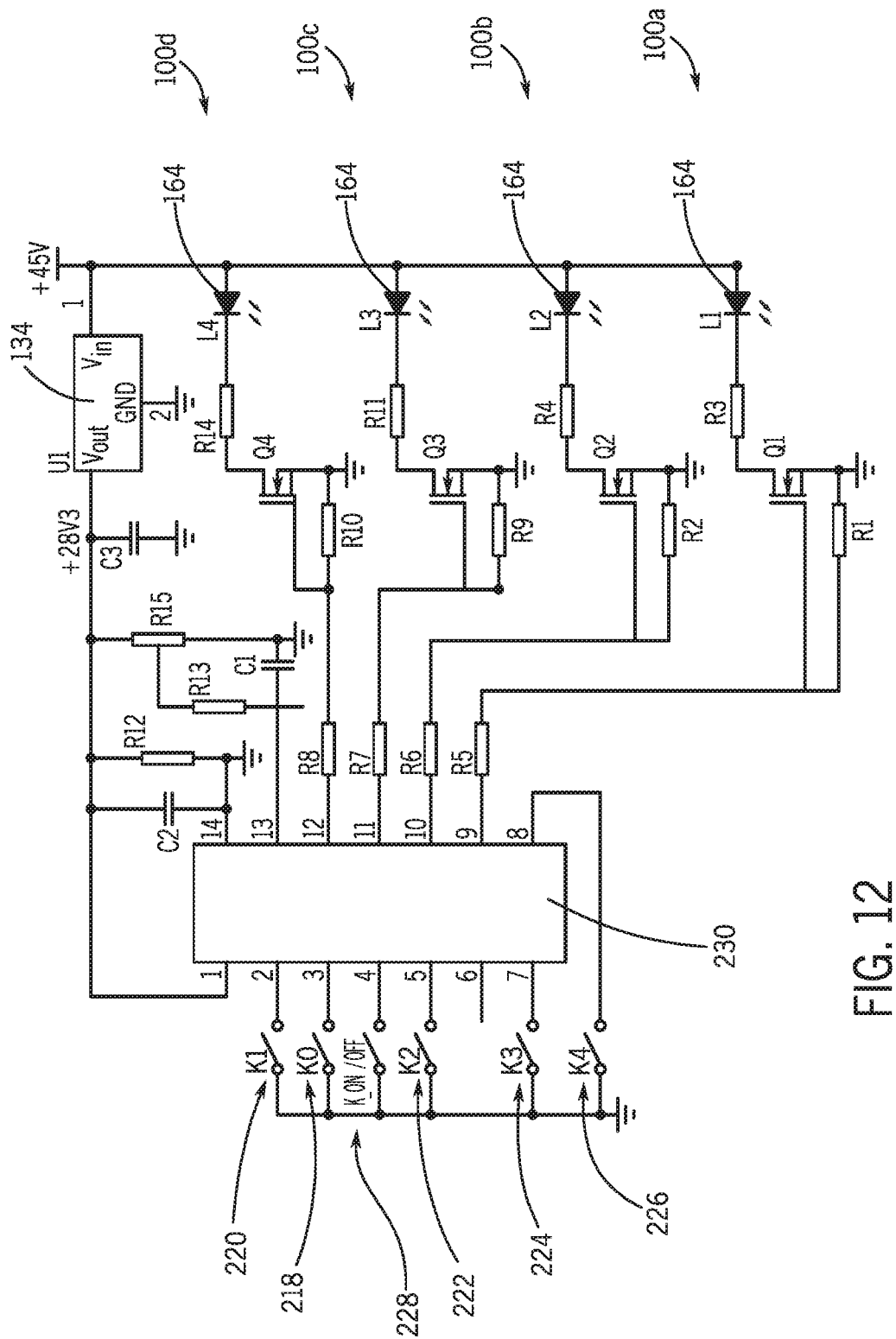
FIG. 12 is a block diagram of the circuitry in the portable light of FIG. 1.

FIG. 12 is a circuit diagram of the components that are contained within the portable light 10. In particular, the circuit components shown in FIG. 12 include: i) switches 218-226 that correspond to mode indicia 110a-110e, ii) switch 228 that corresponds to the luminosity selector assembly 28, iii) the power source 134, iv) lighting elements 100a-100d, v) resistors and capacitors that are disposed either the luminosity PCB 54, the mode selector PCB 84, or the first power source PCB 124, which include R5-R8, R12, R13, R15, C1-C3, and vi) microcontroller 230. In this configuration, the microcontroller 230 accepts inputs from the switches 218-228 and power from the power source 134 and outputs control signals to the lighting elements 100a-110d. The circuit elements that are disposed on the either of the PCBs 54, 84, or 124 protect the microcontroller from current spikes or electrical noise, act as an electrical filter, or act as a dimming potentiometer for the luminosity selector assembly 28. Also, as shown in FIG. 12, each lighting element 100a-100d includes: i) emitter assembly 164, ii) two resistors (e.g., R10 and R14), iii) and a transistor (e.g., Q4). Each of these circuit elements contained within the lighting elements 100a-100d are disposed on the lighting element PCB 162. It should be understood that other circuit configuration or the placement of circuit elements on other PCBs is contemplated by this disclosure. Further, it is contemplated by this disclosure that other circuit elements may be included within the portable light 10, such as a wireless communication module, additional microcontrollers, additional switches to control the lumen output or the selection of emitters 164, or any other circuitry required to perform the functions described herein.

The below disclosure of the operation of portable light 10 applies in equal force to all embodiments (e.g., the first embodiment shown in FIGS. 1-13, the second embodiment shown in FIGS. 14-22, and the third embodiment shown in FIGS. 23-25) of the portable elongated lights described herein. Specifically, in operation, a user can: (i) selectively mount the portable light 10 in various ways, (ii) select the luminosity level of the lighting elements 100, and (iii) select which lighting elements are illuminated 100. For example, the user can move the securement member 30 to a deployed position 214, as best shown in FIGS. 1 and 2, where upon the user can then hang the portable light 10 via the deployed securement member 30 to an object or fixture (e.g., a hook) disposed above the portable light 10. Second, the user may releasably attach the magnet 190 residing within the lower end 18 to a magnetic surface or object. Thus, the portable light 10 will be magnetically mounted, to a selected magnetic surface or object at any orientation (e.g., to a tool box or to a metal surface of a vehicle). Third, the user may place the bottom surface 199 of the portable light 10 on a surface support surface 44 and deploy a retractable stabilization assembly 192 (see FIG. 2). Fourth, the user may manually carry the portable light 10 for portable illumination use as a flashlight or lantern between various locations.

Figure 21:
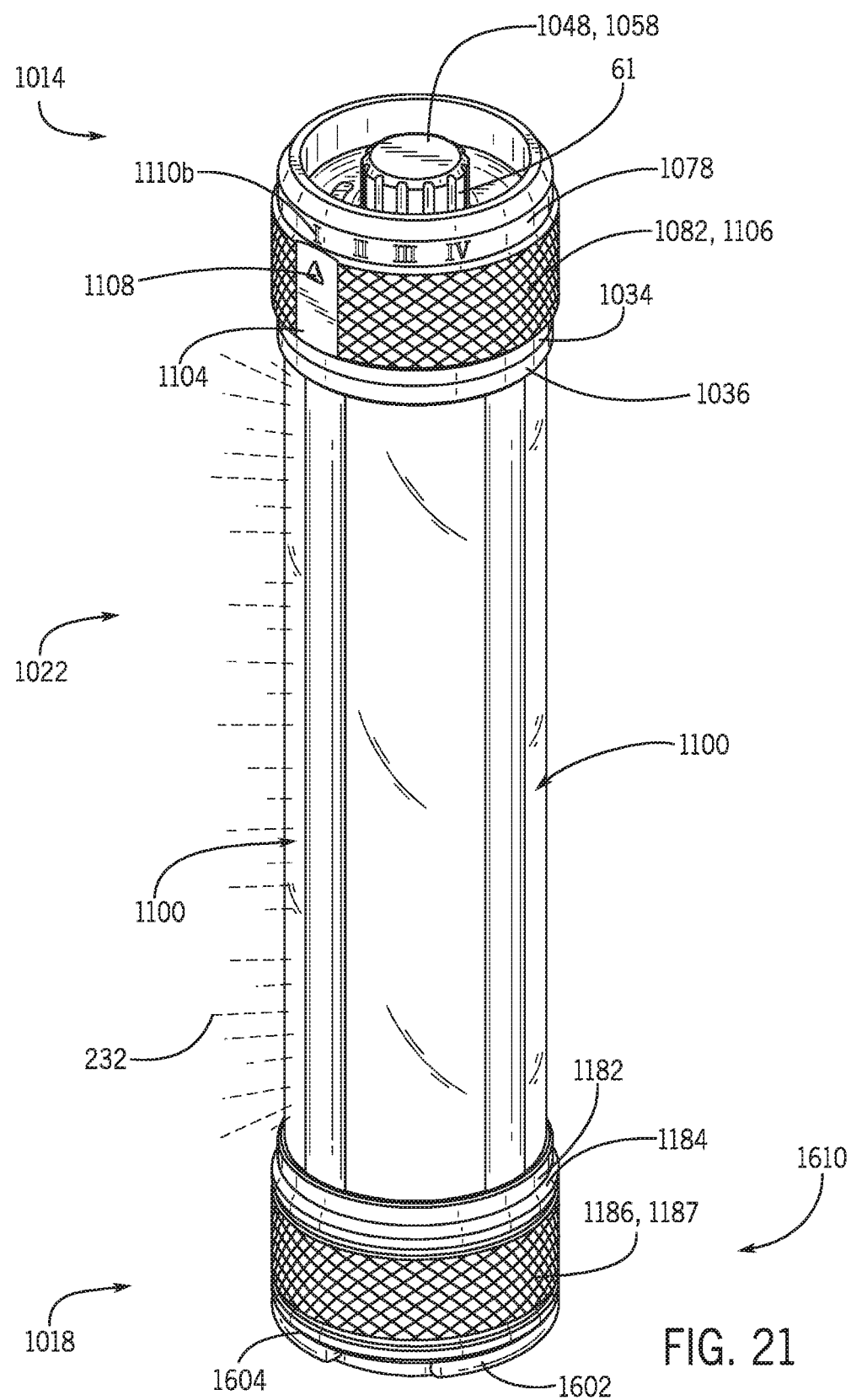
FIG. 21 is a top view of the portable light of FIG. 14, wherein the securement assembly is in the retracted position, a mode selector in a first position, and a single lighting element is in an illuminating state.
Figure 22:
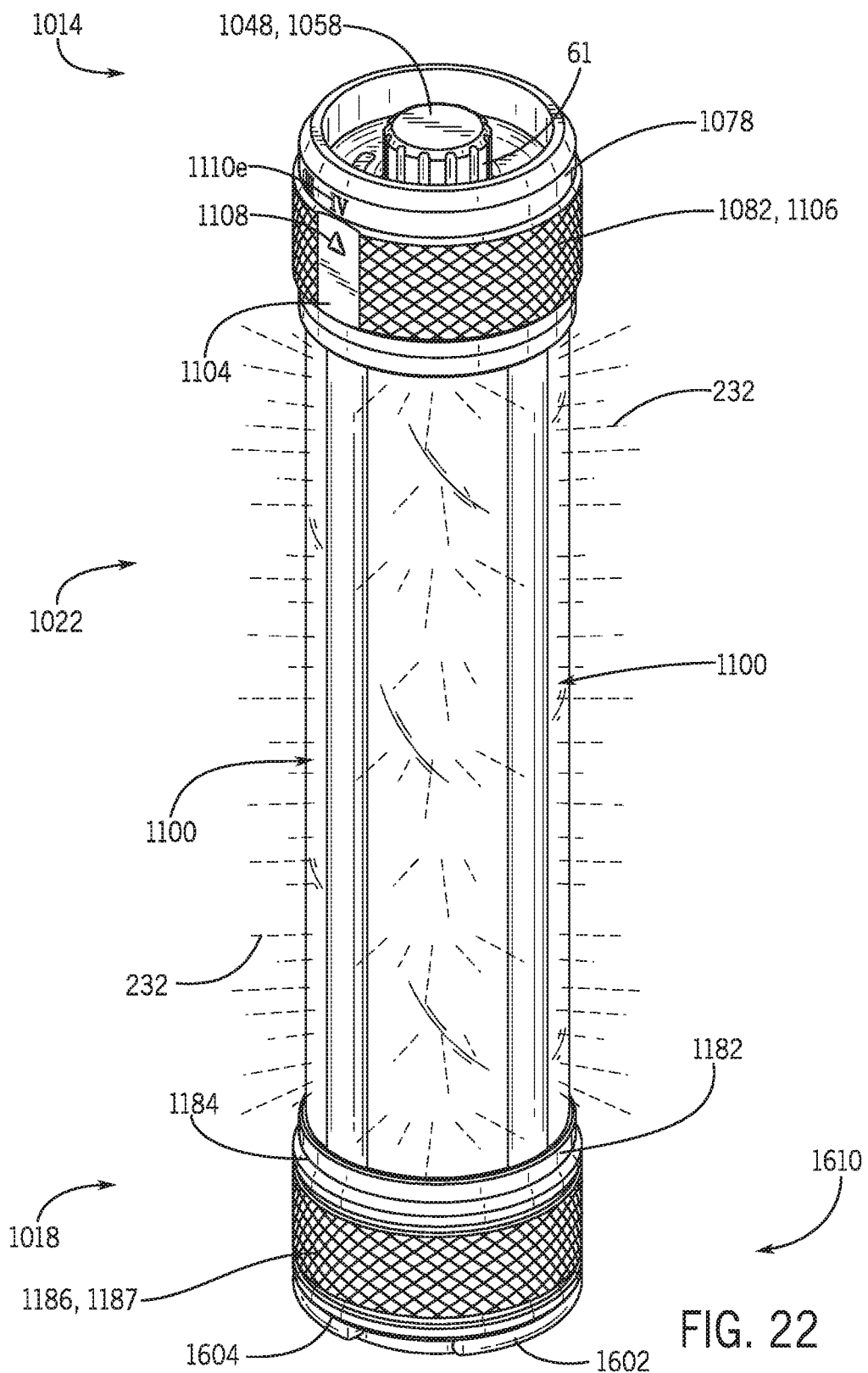
FIG. 22 is a top view of the portable light source of FIG. 14, wherein the securement assembly is in the retracted position, a mode selector in a fourth position, and all four lighting elements are in an illuminating state.

The user also has a plurality of options regarding portable light 10 luminosity levels. The luminosity selector assembly 28 may be manipulated to cause the lighting elements 100 of the portable light 10 to produce zero luminosity. Alternatively, the luminosity selector assembly 28 may be manipulated to cause one or more of the lighting elements 100 to produce various degrees of light. While FIGS. 1-11, 14-20, and 23-25 illustrate the lighting elements 100 as producing zero light, FIGS. 21-22 show each of the lighting elements 100 as emitting light, as indicated by light lines 232.

The user further has a plurality of options regarding portable light 10 operational modes. The operational modes can be selected or changed by manipulating the mode selector ring 82 relative to the mode indicia 110. In some implementations, as shown in the figures, the selection indicator 108 on the mode selector ring 82 is rotated relative to the mode indicia 110. The mode indicia 110 may include images or numerals, exemplarily shown as I, II, III and IV. When the selection indicator 108 is arranged correspondingly to one of the mode indicia 110 (I, II, III and IV), the portable light 10 will operate in the operational mode corresponding to the selected mode indicia 110 (I, II, III and IV). It is to be understood that more, fewer or alternate mode indicia 110 are within the scope of this disclosure.

Some of the operational modes are discussed below. In an "OFF" operational mode, the no lighting elements 100 are illuminate. The portable light 10 can be set to this "OFF" operation mode in two different way. A first way this "OFF" operational mode may be achieved is by the user placing the mode selector ring 82 in the "OFF" position by aligning the selection indicator 108 with mode indicia 110a. In this configuration, it does not matter the setting of the luminosity selector assembly 28 because there are no lighting elements 100 that are selected for illumination. A second way this "OFF" operational mode may be achieved is by the user placing the rotary dial 46 in the "OFF" position 64. In this configuration, it does not matter the setting of the mode selector assembly 32 because there is no current being applied to any of the lighting elements 100.

In a first operational mode, the one of the lighting elements 100 is illuminate. For example, lighting element 100a may be illuminated. This second operation mode is achieved by both: i) rotating the luminosity selector ring 82 to align the selection indicator 108 with mode indicia 110b and ii) rotating the rotary dial 46 to command greater than zero luminosity. If either one of these assemblies 28, 32 are positioned in a different location, then the portable light 10 will not be in a second operation mode. It should be understood that the user may then vary the lumen output of the illuminated lighting element (e.g., 100a) by changing the position of the rotary dial 46. For example, the user may rotate the dial 46 clockwise to increase the lumen output or may rotate the dial 46 counter-clockwise to decease the lumen output.

In a second operational mode, the two of the lighting elements 100 are illuminate. For example, lighting element 100a and 100b may be illuminated. This third operation mode is achieved by both: i) rotating the luminosity selector ring 82 to align the selection indicator 108 with mode indicia 110c and ii) rotating the rotary dial 46 to command greater than zero luminosity. If either one of these assemblies 28, 32 are positioned in a different location, then the portable light 10 will not be in a third operation mode. It should be understood that the user may then vary the lumen output of the illuminated lighting elements (e.g., 100a and 100b) by changing the position of the rotary dial 46.

In a third operational mode, the three of the lighting elements 100 are illuminate. For example, lighting element 100a, 100b, and 100c may be illuminated. This fourth operation mode is achieved by both: i) rotating the luminosity selector ring 82 to align the selection indicator 108 with mode indicia 110d and ii) rotating the rotary dial 46 to command greater than zero luminosity. If either one of these assemblies 28, 32 are positioned in a different location, then the portable light 10 will not be in a fourth operation mode. It should be understood that the user may then vary the lumen output of the illuminated lighting elements (e.g., 100a, 100b, and 100c) by changing the position of the rotary dial 46.

In a fourth operational mode, all four of the lighting elements 100 are illuminate. For example, lighting element 100a, 100b, 100c, and 100d may be illuminated. This fourth operation mode is achieved by both: i) rotating the luminosity selector ring 82 to align the selection indicator 108 with mode indicia 110e and ii) rotating the rotary dial 46 to command greater than zero luminosity. If either one of these assemblies 28, 32 are positioned in a different location, then the portable light 10 will not be in a fifth operation mode. It should be understood that the user may then vary the lumen output of the illuminated lighting elements (e.g., 100a, 100b, 100c, and 100d) by changing the position of the rotary dial 46.

In some embodiments, adjacent lighting elements 100, such as 100a and 100b or 100a-100c, may illuminate when a user manipulates both assemblies 28, 32 to command such light output. In other embodiments, non-adjacent lighting elements 100, such as 100a and 100c or 100b and 100d, may illuminate when a user manipulates both assemblies 28, 32 to command such light output. Other operational modes may be configured within the portable light 10. For example, such operational modes may include: i) one or more of the lighting elements 100 operating in a flashing pattern (e.g., strobe, SOS, or etc.), ii) one or more of the lighting elements 100 illuminating a color different in comparison to the other lighting elements 100, iii) one or more of the lighting elements 100 illuminating different lumen outputs in comparison to the other lighting elements 100 (e.g., 100a outputs 2000 lumen, while 100b outputs 500 lumen), iv) one or more of the lighting elements 100 illuminating only part of the lighting element 100 (e.g., one the bottom half of the lighting element 100 is illuminated), v) or a combination of any of these operational modes.

Similar to the portable light 10 as described above, FIGS. 14-22 show another embodiment of a portable light 1001. The portable light 1001 can be selectively mounted in a various ways, can selected which lighting elements 1100 are illuminated, and select the luminosity level of the lighting elements 1100. For sake of brevity, the above disclosure in connection with portable light 10 will not be repeated below, but it should be understood that across embodiments like numbers represent like structures. For example, the disclosure relating to lighting elements 100 applies in equal force to lighting elements 1100. Further, it should be understood that the operational modes of the portable light 1001 are similar to, or identical to, those disclosed regarding portable light 10. Moreover, it is to be understood that any one or more features of the portable light 10 can be used in conjunction with those disclosed regarding the portable light 1001, and that any one or more features of the portable light 1001 can be used in conjunction with those disclosed regarding the portable light 10.

The primary differences between portable light 10 and portable light 1001 are: i) the omission of the securement member 30 from the top assembly 1024, ii) the replacement of the retractable stabilization assembly 192 with a securement assembly 1600, and iii) a rotary dial 1046 that has dial grooves 61. Other than these differences, the portable light 1001 is mechanically and electrically the same as the portable light 10.

The securement assembly 1600 can support, suspend and/or brace the portable light 10 during operation, storage and/or transportation. The second end 1018 includes a securement assembly 1600, which is pivotally attached to the second end 1018. In other words, this configuration allows the securement assembly 1600 to be pivotally attached to the second end 1018 and can selectively rotate among a plurality of orientations with respect to the second end 1018.

The securement assembly 1600 has a first arcuate member 1602. The first arcuate member 1602 may be selectively disposed in a first, or stowed, position 1610, as exemplarily shown in FIGS. 16-18 and 21-22. In the first position 1610, the first arcuate member 1602 is positioned adjacent to the magnet 1190 and above the bottom surface 199 of the bottom housing 186. Thus, the first arcuate member 1602 is positioned within the recess or circular groove 1206. In this first position 1610, the first arcuate member 1602 lies in a plane substantially parallel with the bottom surface 199 of the bottom housing 186. In this second position 1612, the first arcuate member 1602 may be positioned at any angle that places it below the bottom surface 199 and is fully deployed when first arcuate member 1602 is positioned substantially perpendicular to the bottom surface 199. It should be understood that the first arcuate member 1602 may also have a releasable locking system (not shown), which may secure the first arcuate member 1602 in one or more positions (e.g., first position 1610 or the second position 1612).

The securement assembly 1600 may also have a second arcuate member 1604. The second arcuate member 1604 may be selectively disposed in a first, or stowed, position 1610, as exemplarily shown in FIGS. 16-18 and 21-22. In the first position 1610, the second arcuate member 1604 is positioned adjacent to the magnet 1190 and above the bottom surface 199 of the bottom housing 186. Thus, the second arcuate member 1604 is positioned within the recess or circular groove 1206. In this first position 1610, the second arcuate member 1604 lies in a plane substantially parallel with the bottom surface 199 of the bottom housing 186. In this second position 1612, the second arcuate member 1604 may be positioned at any angle that places it below the bottom surface 199 and is fully deployed when second arcuate member 1604 is positioned substantially perpendicular to the bottom surface 199. It should be understood that the second arcuate member 1604 may also have a releasable locking system (not shown), which may secure the second arcuate member 1604 in one or more positions (e.g., first position 1610 or the second position 1612).

When both the first and second arcuate members 1602, 1604 are in the second position (see FIG. 20), the arcuate members 1602, 1604 form an arch that extends from one side of the portable light 1001 to the other side of the portable light 1001. Additionally, it should be understood that the first and second arcuate members 1602, 1604 can be moved independently from each other. Further, it is contemplated by this disclosure that the arcuate members 1602, 1604 may have other shapes or thickness.

Similar to the portable light 10 as described above, FIGS. 23-25 show another embodiment of a portable elongated light 2001. The portable elongated light 2001 can be selectively mounted in a various ways, can selected which lighting elements 2100 are illuminated, and select the luminosity level of the lighting elements 2100. For sake of brevity, the above disclosure in connection with portable light 10 will not be repeated below, but it should be understood that across embodiments like numbers represent like structures. For example, the disclosure relating to lighting elements 100 applies in equal force to lighting elements 2100. Further, it should be understood that the operational modes of the portable elongated light 2001 are similar to, or identical to, those disclosed regarding portable light 10. Moreover, it is to be understood that any one or more features of the portable light 10 can be used in conjunction with those disclosed regarding the portable elongated light 2001, and that any one or more features of the portable elongated light 2001 can be used in conjunction with those disclosed regarding the portable light 10.

The primary differences between portable light 10 and portable elongated light 2001 are: i) the omission of the textured or knurled surface 106 from the mode selector ring 1082, ii) the omission of the textured or knurled surface 187 from the bottom housing 1186, and iii) the movement of the securement member 1030 from being positioned adjacent to the outer surface of the later face 1078 to being placed within the recess 1038. Positioning the securement member 1030 within the recess 1038 may be beneficial as may reduce the changes that the securement member 1030 will be unintentionally be caught on a projection, which may break the securement member 1030.

The follow discusses accessories that may be used in connection with the portable light 10. For sake of brevity, the following accessories will only be discussed in connection with portable light 10. However, it should be understood that the following accessories may be used in connection with any embodiment of the portable light 10, including the second embodiment 1001 and the third embodiment 2001. A first accessory may include a flashlight head that can be connected the second end 18 of the portable light 10. Specifically, the user may remove the second end assembly 142 from the portable light 10 and replace this assembly 142 with a flashlight head. This first accessory would be directly connected to the power source 134 and would draw power therefrom. The first accessory may include a cone shaped body, a reflector positioned within the cone shaped body, an emitter positioned at the base of the reflector, and a switch. This first accessory allows a user to focus light in a direction that is perpendicular to the lighting elements 100. During operation, this first accessory may disable the lighting elements or may be above to functional along with them. This accessory may be desirable because it may allow the portable elongated light to switch operate as a lantern (e.g., illuminating the lighting elements) in a first mode and operate like a portable flashlight (e.g., illuminating the flashlight head) in a second mode.

A second accessory may include a speaker that can be connected the second end 18 of the portable light 10. Specifically, the user may remove the second end assembly 142 from the portable light 10 and replace this assembly 142 with a speaker. This second accessory would be directly connected to the power source 134 and would draw power therefrom. The second accessory may include a wireless module, a one/off button, and a pairing button. The wireless module contained within the speaker allows a user to connect a portable device, like a cellular phone or laptop, in order for the speaker to receive and play audio signals. The on/off button turns on and off the speaker and the pairing button sends a signal to the wireless module to facilitate the pairing of the wireless module with the portable device. This second accessory may have the same diameter or a larger diameter than the portable light 10. This second accessory enables the user to listen to music, while utilizing the light that is emitted from the portable light 10.

A third accessory may include a sensor, a wireless module, or a sensor and wireless module that can be connected the second end 18 of the portable light 10. Specifically, the user may remove the second end assembly 142 from the portable light 10 and replace this assembly 142 with a sensor or wireless module. This third accessory would be directly connected to the power source 134 and would draw power therefrom. The sensor may be motion, light, pressure, moisture, acceleration, sound, or any combination of these sensors. The wireless module may be compatible with Bluetooth, NFC, Felica, WiFi, Zigbee, RFID, cellular, WiMAX, ISM, or any combination of these technologies. For example, if a local light sensor is contained within the third accessory, the portable light 10 may un-illuminate the lighting elements 100 in response to detecting light that is local to the portable light 10. In another example, if a local sound sensor (e.g., a microphone) is contained within the third accessory, the user may use voice commands to turn on the portable light 10. Alternatively, if a wireless module is attached to the portable light 10, then the elongated light can be controlled by a remote device (e.g., cellular phone, laptop, RF remote control, wireless camera, remote motion sensor, remote light sensor, timer, or remote devices described in U.S. patent application Ser. No. 15/812,852, filed on May 17, 2018, and which is fully incorporated herein by reference). This third accessory enables the control of the portable light 10 by either remotely by a user or by sensors, which may be desirable in a number of situations.

The fourth accessory may include a tripod. Specifically, the user may remove the second end assembly 142 from the portable light 10 and replace this assembly 142 with a connector that can attach to a tripod. This accessory may be beneficial for work at construction sites or a photo shoot.

The fifth accessory may include a charging base. Specifically, the user may remove the second end assembly 142 from the portable light 10 and replace this assembly 142 with second end assembly that includes an usb receptacle or multiple usb receptacles. Specifically, the receptacles may be positioned in the current location of the magnet 190 or they may be positioned on the surface of the bottom housing 186 that is perpendicular to the bottom surface 199. The positioning on this lateral surface may be beneficial because it would allow a user to place the second end 18 on the support surface, while having access to the usb receptacle. This fifth accessory would be directly connected to the power source 134 and would draw power therefrom.

The sixth accessory may include different types or spare power sources 134. Accordingly, this sixth accessory may be a removable non-rechargeable battery, a combination of removable non-rechargeable batteries, a removable rechargeable battery, a combination of removable rechargeable batteries, a combination of removable rechargeable batteries disposed within a battery cartridge 250, a non-removable rechargeable battery, a combination of non-removable rechargeable batteries disposed within a battery cartridge 250, a DC power supply that is configured to connect to a 12 volt car battery, a DC power supply that is configured to connect to a 110 volt alternative current outlet, or any other type of power supply that is known to a person of skill in the art.

The seventh accessory may include any combination of accessories one through sixth. For example, it may be desirable to have a portable light 10 that has a rechargeable battery that includes an usb receptacle thereon and the bottom housing may also have an usb receptacle. This would allow the user to charge the rechargeable battery using an usb cable. After the battery is charged and placed within the portable light 10, the user can then charge their cellular phone from the portable light 10 without removing the battery from the light. Alternatively, it may be desirable to use a tripod in connection with a power source that includes an AC-DC converter. Other embodiments or combinations are contemplated by this disclosure.

The portable light 10 enables numerous benefits over prior lighting systems. Unlike a lighting system that merely offers a single mounting configuration, luminosity mode and/or operational mode, the present disclosure provides for a system that synergistically and advantageously combines at least all of these features to create a unified system providing flexibility, portability and varied operational mode capabilities.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings. Other implementations are also contemplated.

While some implementations have been illustrated and described, numerous modifications come to mind without significantly departing from the spirit of the disclosure; and the scope of protection is only limited by the scope of the accompanying claims. For example, the overall shape of the portable light 10 may be a triangular prism, a rectangular prism, a cube, a pentagonal prism, a hexagonal prism, octagonal prism, sphere, a cone, a tetrahedron, a cuboid, a dodecahedron, a icosahedron, a torus, a octahedron, a ellipsoid, or any other similar shape. Specifically, the portable light 10 can have a triangular or spherical shape and includes an arrangement of a plurality of ribs 150, lighting elements 100, as well as the mode selector assembly 32 and the luminosity selector assembly 28. In this embodiment, the mode selector assembly 32 and the luminosity selector assembly 28 may be depressible buttons. Similarly, the portable light 10 may be configured to have a hexagonal prism shape, where there are six lighting elements 100. Specifically, the lighting elements 100 may be positioned on the sides of the prism and the ribs 150 may be positioned on the vertices. Further, the mode selector assembly 32 and the luminosity selector assembly 28 may be positioned on the top of the hexagonal prism.

The portable light 10 may have a length that is between 14 and 4 inches, preferably between 12 and 6 inches, and most preferably between of 10 and 8 inches. The portable light 10 may have a width that is between 5 and 0.5 inches, preferably between 3 and 1 inches, and most preferably between 2 inches and 1.5 inches. For example, the portable light 10 make have a length that is approximately 8 times the width, preferably 6 times the width, and most preferably at least 5 times the width. In a commercial embodiment, the portable light 10 may have a length that is approximately 9.5±1 inches and a diameter that is approximately 1.7±0.5 inches. This configuration allows the portable light 10 to have an elongated configuration, as the length is substantially greater than the width.

In an embodiment where the portable light 10 has a diameter that is 1.8 inches and has four evenly spaced lighting elements 100, the arc length of each lighting element 100 may be between 0.4 and 0.2 inches, preferably between 0.35 and 0.25, and most preferably between 0.32 and 0.28. In an embodiment where the portable light 10 has a diameter that is 1.8 inches and the retractable stabilization assembly 192 is in the retracted position 210, the outer diameter of the retractable stabilization assembly 192 is 1.8 inches. In other words, when the retractable stabilization assembly 192 is in the retracted position 210, the retractable stabilization assembly 192 has an outer diameter that is the same as the diameter of the portable light 10. In an embodiment where the portable light 10 has a diameter that is 1.8 inches and the retractable stabilization assembly 192 is in the deployed position or extended position 212, the outer diameter of the retractable stabilization assembly 192 is between 2.5 inches and 5 inches. In other words, when the retractable stabilization assembly 192 is in the deployed position 212, the retractable stabilization assembly 192 has an outer diameter that is larger outer diameter than the portable light 10. In some embodiments, the when the retractable stabilization assembly 192 is in the deployed position 212, the retractable stabilization assembly 192 has an outer diameter that is 4 times larger than the outer diameter than the portable light 10, preferably 3 times larger than the outer diameter than the portable light 10, and most preferably at least 1.5 times larger than the outer diameter than the portable light 10.

In an alternative embodiment, the mode selector assembly 32 and the luminosity selector assembly 28 may be combined into a single assembly that controls both the luminosity and the operational mode of the portable light 10. For example, this combination assembly may be one or more buttons, switches, sliders, local sensors (e.g., motion, light, sound, heat, motion), or other types of electrical selection devices. In one embodiment, this combination assembly may be a single button that allows the user to select the illumination mode and the operation mode of the portable light 10 by utilizing a combination of depressing and/or holding the button in a depressed state. For example, the user: (i) may depress the button one time to turn "On" on a single lighting element 100, (ii) may depress the button three time to turn "On" on a three lighting element 100, and (iii) depress and hold the button a predetermined amount of time to alter the brightness or luminosity level. Additionally, this single assembly may be remotely located from the portable light 10. Accordingly, in this configuration, the portable light 10 would not have any features on the portable light 10 itself that would allow a user to control the operation of the lighting elements 100. This configuration may allow the portable light 10 to be waterproofed for up to 30 meters. For example, the luminosity selector assembly 28 may be located on a remote wireless device, such as the remote devices described in U.S. patent application Ser. No. 15/812, 852, filed on May 17, 2018, and which is fully incorporated herein by reference. Another example of a remote wireless device includes a cellphone, laptop, RF remote control, or other devices that are connected to the portable light 10 via the internet (e.g., wireless camera, motion sensor, light sensor, timer, etc.).

In one embodiment, the emitter assembly 164 may be a COB LED, which does not need a secondary optic, they have good heat dissipation, and can have a higher density to form a more uniform/higher lumen light. It should be understood that different types of emitter assembly 164 may be utilized, such: (i) a standard LED, (ii) organic LED, (iii) induction light panel, (iv) silicon quantum dot phosphor (SiQD-phosphor), or (v) surface-mount device LED. Further, it should be understood that a combination of the different types of emitter assembly 164 may be utilized. For example, one light emitter assembly 164 may be a surface mounted LED, while other light emitters 164 may be COB LEDs. It should also be understood, that lens 168 may also be omitted. In this configuration, there is no primary optic, no secondary optic, and no reflector.

Depending on type of selected emitter assembly 164 and the light distribution pattern, the shape of the lens 168 may vary. For example, as shown in FIGS. 10-11, the lens 168 may have a substantially uniform thickness across the emitter assembly 164. It should be understood that while the lens 168 may continue to have a substantially uniform thickness, the lens 168 may have a greater curvature or less curvature, which in turn will provide a more focused or less focused light distribution pattern, respectively. It should be understood that the outer surface 174 of the lens 168 may have a different configuration, where the lens 168 does not have a substantially uniform thickness. For example, the outer surface 174 of the lens 168 may have a greater curvature than the inner surface 172. Other thickness variations and/or curvatures combinations are contemplated by this disclosure. For example, some of the lighting elements 100 may have a lens 168 that has a greater curvature, while other lighting elements 100 may have a lens 168 that has a greater curvature. This configuration allows the user to further choose the desired light distribution pattern.

The upper housing 26, intermediate housing 140, and the bottom housing 185 may be combined into a single housing and the power source may be a rechargeable battery that is not intended to be removed from the housing. The upper housing 26, intermediate housing 140, and bottom housing 186 may be formed from metal, such as aluminum or steel, a polymer material, such as plastic, or a combination of metal and a polymer material. The lens 168 may be made from a polymer material, such as plastic, and may be transparent, partially-transparent, or colored. Some or all of the ribs 150 may be made from a magnet material. The outer rim 40 may also be made from a magnet material.

All elements of the portable light 10 may be colored black except for: i) selection indicator 108, ii) mode indicia 110, iii) cap 48, iv) luminosity indicator 62, v) lighting elements 100, vi) connector ring 36, and connector ring 182. In particular, the connector rings 36, 182 may be colored green. The outer surface 176 of the ribs 150 may include indicia, such as the manufacturer of the light 10 or may be personalized to include a person's name or information.

Headings and subheadings, if any, are used for convenience only and are not limiting. The word exemplary is used to mean serving as an example or illustration. To the extent that the term include, have, or the like is used, such term is intended to be inclusive in a manner similar to the term comprise as comprise is interpreted when employed as a transitional word in a claim. Relational terms such as first and second and the like may be used to distinguish one entity or action from another without necessarily requiring or implying any actual such relationship or order between such entities or actions.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

Numerous modifications to the present disclosure will be apparent to those skilled in the art in view of the foregoing description. Preferred embodiments of this disclosure are described herein, including the best mode known to the inventors for carrying out the disclosure. It should be understood that the illustrated embodiments are exemplary only, and should not be taken as limiting the scope of the disclosure.

The invention claimed is:

1. A portable light comprising:
a central body including:
a plurality of external longitudinal ribs that extend along the entire length of the central body;
a plurality of lighting elements, wherein one of the plurality of lighting elements resides between a pair of the plurality of external longitudinal ribs;
a plurality of lenses, wherein one of the plurality of lenses overlies one of the plurality of lighting elements; and
a power source positioned within the plurality of lighting elements;
a first end assembly operably coupled to a first end portion of the central body and the power source; and
a second end assembly operably coupled to a second end portion of the central body.

2. The portable light of claim 1, wherein the power source includes a battery cartridge having a first end and a second end, wherein either end of the battery cartridge can be oriented to operably place all batteries contained within the battery cartridge in contact with the first end assembly without reconfiguring the battery cartridge or circuitry contained within the portable light.

3. The portable light of claim 1, wherein the power source is a rechargeable battery configured to supply power to a receptacle that is positioned within the second end assembly.

4. The portable light of claim 1, wherein each one of the plurality of lighting element includes an emitter assembly operably connected to a lighting element printed circuit board (PCB), said emitter assembly being a chip on board (COB) LED.

5. The portable light of claim 4, further comprising a power source printed circuit board (PCB) with an aperture, and wherein an extent of the lighting element PCB extends through the aperture and is electrically coupled to the power source PCB.

6. The portable light of claim 1, the first end assembly includes a mode selector that is slidingly coupled to the first end assembly, wherein a user displaces the operating mode selector relative to an extent of the upper housing to select which lighting element is to be illuminated during operation of the portable light.

7. The portable light of claim 6, wherein the operating mode selector overlaps an extent of the upper housing while an upper flange of the upper housing remains exposed, said upper flange including lighting element indicia designating which lighting element is to be illuminated during operation of the portable light.

8. The portable light of claim 1, wherein the first end assembly further includes a luminosity selector assembly to selectively control lumen output of the lighting elements that are selected for illumination during operation of the portable light.

9. The portable light of claim 1, wherein the second end assembly includes a motion sensor or a speaker.

10. The portable light of claim 1, wherein the second end assembly includes a second light source that emits a second light pattern that is oriented axially to the central body.

11. The portable light of claim 1, wherein the portable light has an elongated configuration with a length that is between five to eight times a width of the central body of the portable light.

12. The portable light of claim 1, wherein each one of the external longitudinal ribs have an outer surface and each one of the plurality of lenses have an outer surface, wherein an extent of the outer surface of one of the plurality of lenses is substantially flush with the outer surface of one of the external longitudinal ribs.

13. A portable light comprising:
a central body defining a tubular receiver, the central body having:
a channel extending longitudinally along the central body and being positioned radially outward of the tubular receiver;
a lighting element residing within the channel;
a lens overlying the lighting element;
a power source positioned within the tubular receiver of the central body, and wherein said power source extends along the entire length of the central body; and
an end assembly operably coupled to the central body and the power source.

14. The portable light of claim 13, wherein the end assembly includes an operating mode selector assembly configured to control operation of the portable light.

15. The portable light of claim 14, wherein the operating mode selector assembly is a single depressible button.

16. The portable light of claim 13, wherein the central body further includes an external longitudinal rib extending longitudinally along the central body, wherein the channel is positioned adjacent the external longitudinal rib.

17. The portable light of claim 16, wherein an outer surface of the external longitudinal rib is substantially flush with an outer surface of the lens.

18. The portable light of claim 17, wherein the longitudinal rib includes a projection that is configured to receive a peripheral edge of the lens.

19. The portable light of claim 13, further including a wireless module that is configured to communicate to an external electronic device.

20. The portable light of claim 13, wherein the power source is a rechargeable battery configured to supply power to a receptacle.

21. The portable light of claim 13, further comprising a second end assembly that includes a second light source that emits a second light pattern oriented axially to the central body.

22. The portable light of claim 13, wherein the lighting element has a length that is at least 60% of a length of the power source.

\* \* \* \* \*